United States Patent
Kim et al.

(10) Patent No.: US 11,538,867 B2
(45) Date of Patent: Dec. 27, 2022

(54) ORGANIC ELECTROLUMINESCENT DISPLAY APPARATUS INCLUDING CONTINUOUS PROTECTION LAYER HAVING DIFFERENT RESPECTIVE THICKNESSES FORMED AMONG A PLURALITY OF SUB-PIXELS

(71) Applicant: LG Display Co., Ltd., Seoul (KR)

(72) Inventors: Daehee Kim, Paju-si (KR); JiYoung Park, Paju-si (KR); Hyeju Choi, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 77 days.

(21) Appl. No.: 17/239,259

(22) Filed: Apr. 23, 2021

(65) Prior Publication Data

US 2021/0242289 A1 Aug. 5, 2021

Related U.S. Application Data

(62) Division of application No. 16/660,772, filed on Oct. 22, 2019, now Pat. No. 11,024,678.

(30) Foreign Application Priority Data

Nov. 29, 2018 (KR) .......................... 10-2018-0151383

(51) Int. Cl.
| | | |
|---|---|---|
| *H01L 27/32* | (2006.01) | |
| *H01L 51/52* | (2006.01) | |
| *H01L 51/50* | (2006.01) | |
| *H01L 51/56* | (2006.01) | |

(52) U.S. Cl.
CPC ...... *H01L 27/3218* (2013.01); *H01L 27/3246* (2013.01); *H01L 51/504* (2013.01); *H01L 51/5206* (2013.01); *H01L 51/5221* (2013.01); *H01L 51/5253* (2013.01); *H01L 51/56* (2013.01); *H01L 2227/323* (2013.01); *H01L 2251/558* (2013.01)

(58) Field of Classification Search
CPC ............. H01L 27/3218; H01L 27/3246; H01L 51/5253; H01L 51/504
USPC .......................................................... 257/40
See application file for complete search history.

(56) References Cited

U.S. PATENT DOCUMENTS

| | | | |
|---|---|---|---|
| 7,205,715 B2 | 4/2007 | Park | |
| 2009/0091238 A1* | 4/2009 | Cok | .................... H01L 51/5265 313/498 |

(Continued)

FOREIGN PATENT DOCUMENTS

| | | |
|---|---|---|
| KR | 10-2003-0058151 A | 7/2003 |
| KR | 10-0834344 B1 | 6/2008 |
| KR | 10-2010-0006465 A | 1/2010 |

*Primary Examiner* — Matthew E. Gordon
(74) *Attorney, Agent, or Firm* — Polsinelli PC

(57) ABSTRACT

The present disclosure provides an electroluminescent display apparatus including a substrate including a first subpixel, a second subpixel, and a third subpixel, a first electrode in each of the first subpixel, the second subpixel, and the third subpixel on the substrate, a bank provided in a boundary between any two of the first subpixel, the second subpixel, and the third subpixel to cover an edge of the first electrode, a protection layer on the first electrode and the bank, a light emitting layer on the protection layer, and a second electrode on the light emitting layer.

15 Claims, 14 Drawing Sheets

(56) References Cited

U.S. PATENT DOCUMENTS

2017/0236882 A1* 8/2017 Matsunaga ......... H01L 27/3213
                                                    257/40
2018/0269266 A1* 9/2018 Cancel Olmo ..... H01L 27/3218
2019/0081112 A1* 3/2019 Tsukamoto ......... H01L 51/5234

* cited by examiner

ORGANIC ELECTROLUMINESCENT DISPLAY APPARATUS INCLUDING CONTINUOUS PROTECTION LAYER HAVING DIFFERENT RESPECTIVE THICKNESSES FORMED AMONG A PLURALITY OF SUB-PIXELS

CROSS REFERENCE TO RELATED APPLICATION

This application is a divisional of U.S. application Ser. No. 16/660,772, filed Oct. 22, 2019, which claims the priority of the Korean Patent Application No. 10-2018-0151383 filed on Nov. 29, 2018, of which the full disclosures of these applications are incorporated herein by reference for all purposes.

BACKGROUND

Field of the Disclosure

The present disclosure relates to an electroluminescent display apparatus, and more particularly, to an electroluminescent display apparatus for emitting lights of different colors from subpixels.

Description of the Background

Electroluminescent display apparatuses are apparatuses where a light emitting layer is provided between two electrodes (i.e., an anode electrode and a cathode electrode) and emits light with an electric field generated between the two electrodes, thereby displaying an image.

The light emitting layer may be formed of an organic material or an inorganic material such as a quantum dot. In the light emitting layer, an exciton is generated by a combination of an electron and a hole, and when the exciton is shifted from an excited state to a ground state, light is emitted.

The light emitting layer may emit lights of different colors (for example, red, green, and blue) in subpixels and may emit lights of the same color (for example, white light) in the subpixels.

In a case where the light emitting layer emits light of the same color (for example, white light) in each subpixel, an electric charge moves through the light emitting layer between subpixels adjacent to each other, and due to this, a leakage current occurs, causing the degradation in image quality.

On the other hand, in a case where the light emitting layer emits lights of different colors (for example, red light, green light, and blue light) in subpixels, the leakage current does not occur. In this case, however, there is a limitation in a process of precisely depositing different light emitting layers in the subpixels which are densely arranged.

SUMMARY

Accordingly, the present disclosure is directed to an electroluminescent display apparatus that substantially obviates one or more problems due to limitations and disadvantages of the prior art.

An aspect of the present disclosure is to provide an electroluminescent display apparatus in which different light emitting layers are provided in subpixels to prevent the occurrence of a leakage current, and thus, different light emitting layers are precisely provided in the subpixels which are densely arranged.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, there is provided an electroluminescent display apparatus including a substrate including a first subpixel, a second subpixel, and a third subpixel, a first electrode in each of the first subpixel, the second subpixel, and the third subpixel on the substrate, a bank provided in a boundary between any two of the first subpixel, the second subpixel, and the third subpixel to cover an edge of the first electrode, a protection layer on the first electrode and the bank, a light emitting layer on the protection layer, and a second electrode on the light emitting layer.

In another aspect of the present disclosure, there is provided an electroluminescent display apparatus including a first pixel including a first subpixel emitting light of a first color, a second subpixel emitting light of a second color, and a third subpixel emitting light of a third color, the first pixel being provided in a substrate, a second pixel including the first subpixel, the second subpixel, and the third subpixel in the substrate, the second pixel being provided in the substrate, a first electrode in each of the first subpixel, the second subpixel, and the third subpixel in each of the first pixel and the second pixel, a protection layer on the first electrode, a light emitting layer on the protection layer, and a second electrode on the light emitting layer, wherein the protection layer includes a first portion overlapping the first subpixel, a second portion overlapping the second subpixel, a third portion overlapping the third subpixel, a fourth portion overlapping a boundary between any two of the first subpixel, the second subpixel, and the third subpixel, and a fifth portion overlapping a boundary between the first pixel and the second pixel.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of the disclosure, illustrate aspects of the disclosure and together with the description serve to explain the principle of the disclosure.

In the drawings:

FIG. 10A is a cross-sectional view according to an aspect taken along line C-D of FIG. 8, FIG. 10B is a cross-sectional view according to an aspect taken along line E-F of FIG. 8, and FIG. 10C is a cross-sectional view according to an aspect taken along line G-H of FIG. 8.

DETAILED DESCRIPTION

Figure 1:
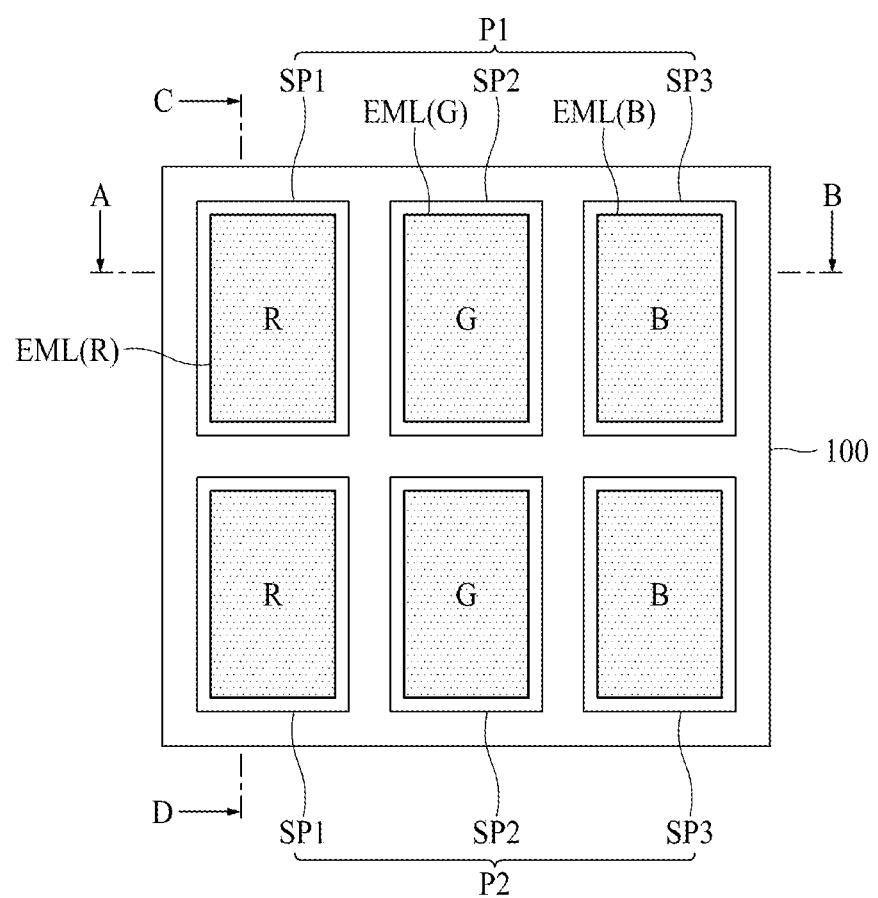
FIG. 1 is a schematic plan view of an electroluminescent display apparatus according to an aspect of the present disclosure.

Reference will now be made in detail to the exemplary aspects of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following aspects described with reference to the accompanying drawings. The present disclosure may, however, be embodied in different forms and should not be construed as limited to the aspects set forth herein. Rather, these aspects are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing aspects of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In construing an element, the element is construed as including an error range although there is no explicit description.

In describing a position relationship, for example, when a position relation between two parts is described as 'on~', 'over~', 'under~', and 'next~', one or more other parts may be disposed between the two parts unless 'just' or 'direct' is used.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

Features of various aspects of the present disclosure may be partially or overall coupled to or combined with each other, and may be variously inter-operated with each other and driven technically as those skilled in the art can sufficiently understand. The aspects of the present disclosure may be carried out independently from each other, or may be carried out together in co-dependent relationship.

Hereinafter, exemplary aspects of the present disclosure will be described in detail with reference to the accompanying drawings.

FIG. 1 is a schematic plan view of an electroluminescent display apparatus according to an aspect of the present disclosure.

As seen in FIG. 1, the electroluminescent display apparatus according to an aspect of the present disclosure may include a plurality of pixels provided in a substrate 100.

The plurality of pixels may include a first pixel P1 and a second pixel P2 which are adjacent to each other. In the drawing, only two pixels P1 and P2 adjacent to each other in a lengthwise direction are illustrated, but the pixels are not limited thereto. In other aspects, the plurality of pixels P1 and P2 may be arranged in a widthwise direction and the lengthwise direction.

Each of the pixels P1 and P2 may include a plurality of subpixels SP1 to SP3. The plurality of subpixels SP1 to SP3 may include a first subpixel SP1, a second subpixel SP2, and a third subpixel SP3.

The first subpixel SP1, the second subpixel SP2, and the third subpixel SP3 may be sequentially arranged in the widthwise direction, and thus, the first subpixel SP1 and the second subpixel SP2 may be disposed adjacent to each other and the second subpixel SP2 and the third subpixel SP3 may be disposed adjacent to each other.

The first subpixel SP1 may be provided to emit red (R) light, the second subpixel SP2 may be provided to emit green (G) light, and the third subpixel SP3 may be provided to emit blue (B) light. However, the present disclosure is not limited thereto, and a color of light emitted from each of the first to third subpixels SP1 to SP3 may be variously changed. In the drawing, an example where the subpixels SP1 to SP3 emitting lights of the same color are arranged in the lengthwise direction is illustrated, but the present disclosure is not limited thereto. In other aspects, an arrangement structure of a plurality of subpixels SP1 to SP3 for each of the pixels P1 and P2 may be changed to various structures known to those skilled in the art.

The first subpixel SP1 may include a red light emitting layer EML(R) emitting red (R) light, the second subpixel SP2 may include a green light emitting layer EML(G) emitting green (G) light, and the third subpixel SP3 may include a blue light emitting layer EML(B) emitting blue (B) light.

In this case, the red light emitting layer EML(R) may be patterned in each of the first subpixel SP1 of the first pixel P1 and the first subpixel SP1 of the second pixel P2. That is, the red light emitting layer EML(R) provided in the first subpixel SP1 of the first pixel P1 may be spaced apart from the red light emitting layer EML(R) provided in the first subpixel SP1 of the second pixel P2.

Similarly, the green light emitting layer EML(G) may be patterned in each of the second subpixel SP2 of the first pixel P1 and the second subpixel SP2 of the second pixel P2. That is, the green light emitting layer EML(G) provided in the second subpixel SP2 of the first pixel P1 may be spaced apart from the green light emitting layer EML(G) provided in the second subpixel SP2 of the second pixel P2. Also, the blue light emitting layer EML(B) may be patterned in each of the third subpixel SP3 of the first pixel P1 and the third subpixel SP3 of the second pixel P2. That is, the blue light emitting layer EML(B) provided in the third subpixel SP3 of the first pixel P1 may be spaced apart from the blue light emitting layer EML(B) provided in the third subpixel SP3 of the second pixel P2.

Hereinafter, an electroluminescent display apparatus according to an aspect of the present disclosure will be described in more detail with reference to a cross-sectional structure.

Figure 2:
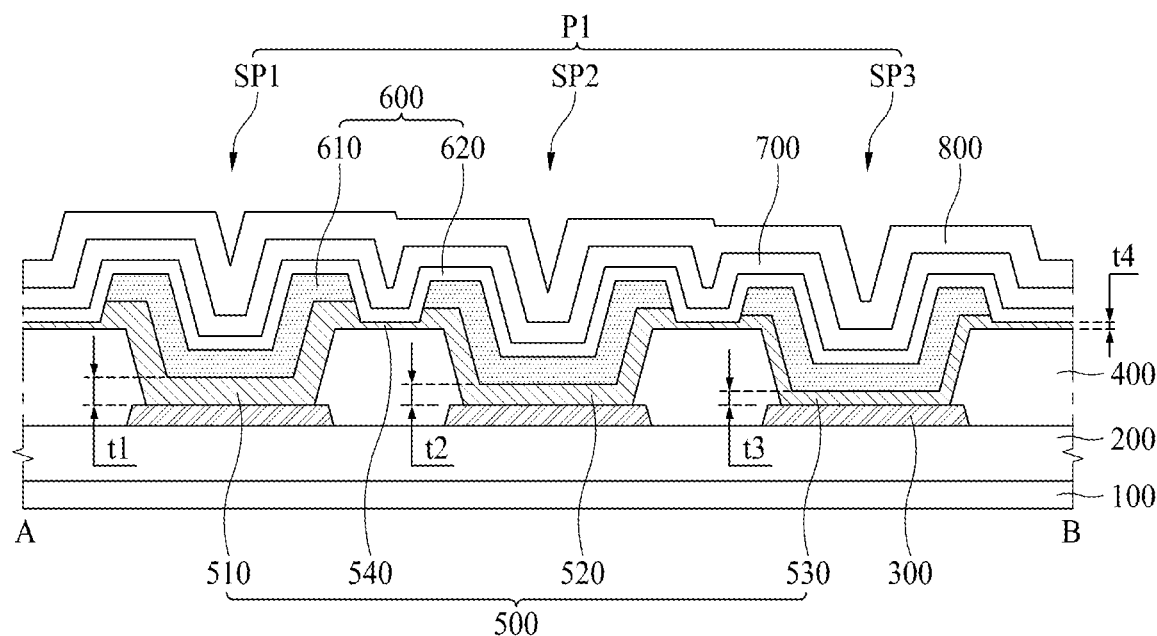
FIG. 2 is a cross-sectional view of an electroluminescent display apparatus according to an aspect of the present disclosure and is a cross-sectional view according to an aspect taken along line A-B of FIG. 1.

FIG. 2 is a cross-sectional view of an electroluminescent display apparatus according to an aspect of the present disclosure and is a cross-sectional view according to an aspect taken along line A-B of FIG. 1.

As seen in FIG. 2, the electroluminescent display apparatus according to an aspect of the present disclosure may include a substrate 100, a circuit device layer 200, a first electrode 300, a bank 400, a protection layer 500, a light emitting layer 600, a second electrode 700, and an encapsulation layer 800.

The substrate 100 may be formed of glass or plastic, but is not limited thereto and may be formed of a semiconductor material such as a silicon wafer. The substrate 100 may be formed of a transparent material or an opaque material. The electroluminescent display apparatus according to an aspect of the present disclosure may be implemented as a top emission type where emitted light is discharged to an upper portion. Accordingly, a material of the substrate 100 may use an opaque material as well as a transparent material.

The circuit device layer 200 may be provided on the substrate 100.

A circuit device including various signal lines, a thin film transistor (TFT), a capacitor, and the like may be provided in the circuit device layer 200 in each of subpixels SP1 to SP3.

The signal lines may include a gate line, a data line, a power line, and a reference line, and the TFT may include a switching TFT, a driving TFT, and a sensing TFT.

The switching TFT may be turned on according to a gate signal supplied through the gate line and may transfer a data voltage, supplied through the data line, to the driving TFT.

The driving TFT may be turned on with the data voltage supplied through the switching TFT and may generate a data current from power supplied through the power line to supply the data current to the first electrode 300.

The sensing TFT may sense a threshold voltage deviation of the driving TFT which causes the degradation in image quality and may supply a current of the driving TFT to the reference line in response to a sensing control signal supplied through the gate line or a separate sensing line.

The capacitor may hold the data voltage supplied to the driving TFT during one frame and may be connected to a gate terminal and a source terminal of the driving TFT.

Each of the switch TFT, the driving TFT, and the sensing TFT may be changed to have various structures such as a top gate structure and a bottom gate structure known to those skilled in the art. Also, the circuit device layer 200 may further include a passivation layer for protecting the switch TFT, the driving TFT, and the sensing TFT and a planarization layer provided on the passivation layer.

The first electrode 300 may be patterned on the circuit device layer 200 in each of the subpixels SP1 to SP3. That is, one first electrode 300 may be provided in the first subpixel SP1, another first electrode 300 may be provided in the second subpixel SP2, and the other first electrode 300 may be provided in the third subpixel SP3. The first electrode 300 may function as an anode of the electroluminescent display apparatus.

The first electrode 300 may be connected to the driving TFT provided in the circuit device layer 200. In detail, the first electrode 300 may be connected to a source electrode or a drain electrode of the driving TFT through a contact hole which is provided in the passivation layer and the planarization layer.

The bank 400 may be provided in a boundary region between the plurality of subpixels SP1 to SP3 to cover an edge of the first electrode 300. The bank 400 may be provided in the boundary region between the plurality of subpixels SP1 to SP3 adjacent to one another, and thus, may be wholly provided in a matrix structure. An emission area may be defined in the plurality of subpixels SP1 to SP3 by the bank 400. That is, an exposure region, which is exposed without being covered by the bank 400, of the first electrode 300 may configure the emission area.

The protection layer 500 may be provided on an upper surface, which is exposed without being covered by the bank 400, of the first electrode 300 and an upper surface of the bank 400 and may protect the first electrode 300 and the bank 400.

The protection layer 500 may include a first portion 510, a second portion 520, a third portion 530 and a fourth portion 540, which have different thicknesses.

The first portion 510 may be provided to overlap the first subpixel SP1. In detail, the first portion 510 may be provided on an upper surface of the first electrode 300 of the first subpixel SP1 and may extend to a portion of an upper surface of the bank 400 along a side surface of the bank 400 adjacent to the first subpixel SP1.

The second portion 520 may be provided to overlap the second subpixel SP2. In detail, the second portion 520 may be provided on an upper surface of the first electrode 300 of the second subpixel SP2 and may extend to a portion of an upper surface of the bank 400 along a side surface of the bank 400 adjacent to the second subpixel SP2.

The third portion 530 may be provided to overlap the third subpixel SP3. In detail, the third portion 530 may be provided on an upper surface of the first electrode 300 of the third subpixel SP3 and may extend to a portion of an upper surface of the bank 400 along a side surface of the bank 400 adjacent to the third subpixel SP3.

The fourth portion 540 may be provided to overlap a boundary region between the subpixels SP1 to SP3, and in detail, may be provided on the upper surface of the bank 400. That is, the fourth portion 540 may be provided on each of an upper surface of the bank 400 between the first subpixel SP1 and the second subpixel SP2, an upper surface of the bank 400 between the second subpixel SP2 and the third subpixel SP3, and an upper surface of the bank 400 between the third subpixel SP3 and the first subpixel SP1.

The fourth portion 540 may be connected to the first portion 510 and the second portion 520 between the first portion 510 and the second portion 520, connected to the second portion 520 and the third portion 530 between the second portion 520 and the third portion 530, and connected to the third portion 530 and the first portion 510 between the third portion 530 and the first portion 510. Therefore, the first portion 510, the second portion 520, the third portion 530, and the fourth portion 540 may be provided in a one-body structure which is wholly connected to one another. Also, the first portion 510, the second portion 520, the third portion 530, and the fourth portion 540 may each be formed of the same material.

The first portion 510 may have a first thickness t1, the second portion 520 may have a second thickness t2, the third portion 530 may have a third thickness t3, and the fourth portion 540 may have a fourth thickness t4. In this case, in the thicknesses t1 to t4, the first thickness t1 may be thickest, the second thickness t2 may be second thick, the third thickness t3 may be third thick, and the fourth thickness t4 may be the thinnest. That is, the thicknesses t1 to t4 may have a relationship "t1>t2>t3>t4".

As described above, according to an aspect of the present disclosure, since the protection layer 500 is provided on the upper surface of the first electrode 300, particles remaining on the upper surface of the first electrode 300 may be covered by the protection layer 500 in a manufacturing process, thereby preventing short circuit caused by the particles. To provide a detailed description, a substrate transfer process, a cleaning process, a baking process, and the like may be performed after the first electrode 300 and the bank 400 are formed, and in such a process, the particles may remain on the upper surface of the first electrode 300. When the light emitting layer 600 and the second electrode 700 are formed on the particles in a state where the particles remain on the upper surface of the first electrode 300, the light emitting layer 600 may not smoothly be stacked on a portion where the particles occur, causing short circuit between the first electrode 300 and the second electrode 700. Therefore, according to an aspect of the present disclosure, since the protection layer 500 is provided on the upper surface of the first electrode 300, although the particles remain on the upper surface of the first electrode 300, the particles may be covered by the protection layer 500, thereby preventing the occurrence of short circuit between the first electrode 300 and the second electrode 700.

Moreover, according to an aspect of the present disclosure, since the protection layer 500 is provided on the upper surface of the bank 400, the protection layer 500 may block a gas which occurs in the bank 400. To provide a detailed description, the bank 400 may be mainly formed of an organic material, the organic material may emit a gas at a high temperature. Therefore, the gas may be emitted from the bank 400 in a process of depositing the organic material at a high temperature or bonding the encapsulation layer 800 after the bank 400 is formed, but in an aspect of the present disclosure, since the protection layer 500 blocks the gas emitted from the bank 400, the light emitting layer 600 may be prevented from being damaged by the gas.

Moreover, according to an aspect of the present disclosure, thicknesses of the first to third portions 510 to 530 configuring the protection layer 500 may differ, and thus, a micro-cavity effect may be easily realized in each of the subpixels SP1 to SP3. To provide a detailed description, when the first electrode 300 includes a reflective electrode and the second electrode 700 includes a semitransparent electrode, reflection and re-reflection of light may be repeated between the reflective electrode and the semitransparent electrode, and in this case, when a distance between the reflective electrode and the semitransparent electrode is an integer multiple of a half wavelength "λ/2" of light having a specific wavelength, constructive interference may occur, thereby enhancing external light extraction efficiency. A characteristic of light may be referred to as a micro-cavity characteristic.

In order to realize a micro-cavity characteristic, a distance between the first electrode 300 and the second electrode 700 should be set differently in the subpixels SP1 to SP3 so that the distance is an integer multiple of a half wavelength "λ/2" of light having a specific wavelength. In an aspect of the present disclosure, a thickness of the first portion 510 provided in the first subpixel SP1, a thickness of the second portion 520 provided in the second subpixel SP2, and a thickness of the third portion 530 provided in the third subpixel SP3 may differ, and thus, the distance between the first electrode 300 and the second electrode 700 may be easily set differently in the subpixels SP1 to SP3. For example, the first subpixel SP1 may be configured as a red subpixel where the distance between the first electrode 300 and the second electrode 700 should be relatively long set because the red subpixel emits light having a long wavelength, and the third subpixel SP3 may be configured as a blue subpixel where the distance between the first electrode 300 and the second electrode 700 should be relatively shortly set because the blue subpixel emits light having a short wavelength.

Since the protection layer 500 is provided between the first electrode 300 and the light emitting layer 600, a hole generated by the first electrode 300 being provided to the light emitting layer 600 may be hindered by the protection layer 500. Therefore, the protection layer 500 may be formed of a material which enables the hole generated by the first electrode 300 to be easily provided to the light emitting layer 600. For example, the protection layer 500 may include an inorganic material such as indium zinc oxide (IZO) capable of showing a tunneling effect. Also, the tunneling effect may be enhanced by appropriately adjusting a thickness of the protection layer 500, and thus, the hole may be more easily transferred. To this end, a thickness of the protection layer 500 (particularly, a thickness of the first portion 510 which is thickest) may be set to 0.3 μm or less.

The light emitting layer 600 may be provided on the protection layer 500. The light emitting layer 600 may include a lower layer 610 and an upper layer 620.

The lower layer 610 may be patterned in each of the subpixels SP1 to SP3. That is, one lower layer 610 may be patterned in the first subpixel SP1, another lower layer 610 may be patterned in the second subpixel SP2, and the other lower layer 610 may be patterned in the third subpixel SP3.

The lower layer 610 provided in the first subpixel SP1 may include a light emitting layer emitting light of a first color (for example, red), the lower layer 610 provided in the second subpixel SP2 may include a light emitting layer emitting light of a second color (for example, green), and the lower layer 610 provided in the third subpixel SP3 may include a light emitting layer emitting light of a third color (for example, blue). As described above, according to an aspect of the present disclosure, the subpixels SP1 to SP3 may emit lights of different colors, and thus, a color filter may not necessarily be needed.

The lower layer 610 of the first subpixel SP1 may overlap the first portion 510 of the protection layer 500 and may have the same pattern as that of the first portion 510. That is, one end and the other end of the lower layer 610 of the first subpixel SP1 may match one end and the other end of the first portion 510. Also, the lower layer 610 of the second subpixel SP2 may overlap the second portion 520 of the protection layer 500 and may have the same pattern as that of the second portion 520. That is, one end and the other end of the lower layer 610 of the second subpixel SP2 may match one end and the other end of the second portion 520. Also, the lower layer 610 of the third subpixel SP3 may overlap the third portion 530 of the protection layer 500 and may have the same pattern as that of the third portion 530. That is, one end and the other end of the lower layer 610 of the third subpixel SP3 may match one end and the other end of the third portion 530. Accordingly, the lower layer 610 of the first subpixel SP1, the lower layer 610 of the second subpixel SP2, and the lower layer 610 of the third subpixel SP3 may be spaced apart from one another with the fourth portion 540 of the protection layer 500 therebetween.

The upper layers 620 may not be respectively patterned in the subpixels SP1 to SP3 and may be provided as one body in the subpixels SP1 to SP3 and a boundary between the subpixels SP1 to SP3. That is, the upper layer 620 may be provided on an upper surface of the fourth portion 540 of the protection layer 500 and an upper surface of the lower layer 610 provided in the first to third subpixels SP1 to SP3.

A configuration of the light emitting layer 600 including the lower layer 610 and the upper layer 620 will be described below with reference to FIG. 3.

Figure 3:
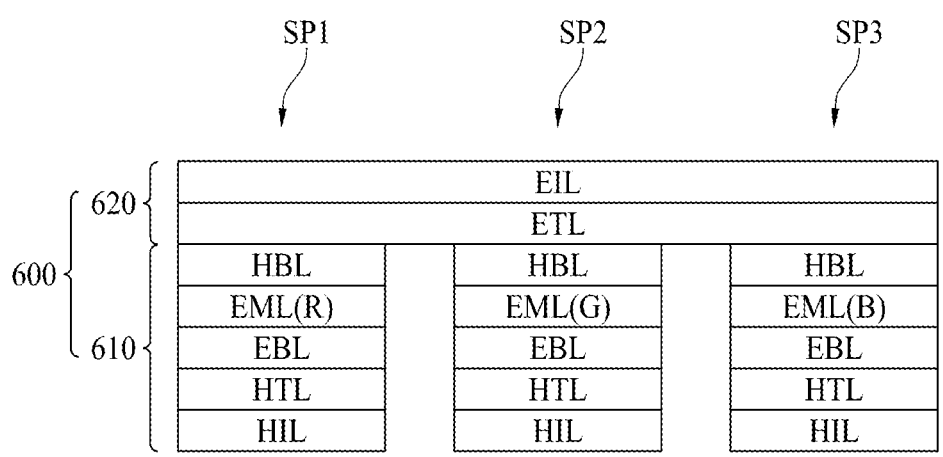
FIG. 3 is a schematic cross-sectional view illustrating a structure of a light emitting layer according to an aspect of the present disclosure.

FIG. 3 is a schematic cross-sectional view illustrating a structure of a light emitting layer according to an aspect of the present disclosure. As seen in FIG. 3, lower layers 610 may be respectively patterned in subpixels SP1 to SP3 and may be spaced apart from one another, and upper layers 620 may be provided as one body on the lower layers 610.

A lower layer 610 of the first subpixel SP1 may be formed of a plurality of organic layers, and in detail, may be provided in a structure where a hole injecting layer HIL, a hole transporting layer HTL, an electron blocking layer EBL, a red light emitting layer EML(R), and a hole blocking layer HBL are sequentially stacked.

A lower layer 610 of the second subpixel SP2 may be formed of a plurality of organic layers, and in detail, may be provided in a structure where a hole injecting layer HIL, a hole transporting layer HTL, an electron blocking layer EBL, a green light emitting layer EML(G), and a hole blocking layer HBL are sequentially stacked.

A lower layer 610 of the third subpixel SP3 may be formed of a plurality of organic layers, and in detail, may be provided in a structure where a hole injecting layer HIL, a hole transporting layer HTL, an electron blocking layer EBL, a blue light emitting layer EML(B), and a hole blocking layer HBL are sequentially stacked.

The organic layers configuring each of the lower layers 610 may be formed of various materials known to those skilled in the art, and configurations of the plurality of organic layers may be variously changed. For example, at least one of the electron blocking layer EBL and the hole blocking layer HBL may be omitted.

The same organic layers configuring each of the lower layers 610 may be formed of the same material, or may be formed of different materials. For example, the hole transporting layer HTL of the first subpixel SP1, the hole transporting layer HTL of the second subpixel SP2, and the hole transporting layer HTL of the third subpixel SP3 may be formed of the same material, or may be formed of different materials. Also, the same organic layers configuring each of the lower layers 610 may each have the same thickness, or may be provided to have different thicknesses on the basis of the micro-cavity characteristic of each of the subpixels SP1 to SP3. For example, a thickness of the hole transporting layer HTL of the first subpixel SP1 may be set to be thickest, the hole transporting layer HTL of the second subpixel SP2 may be set to be second thick, and the hole transporting layer HTL of the third subpixel SP3 may be set to be thinnest.

The upper layer 620 may be formed of a plurality of organic layers, and in detail, may include an electron transporting layer ETL provided on the hole blocking layer HBL and an electron injecting layer EIL provided on the electron transporting layer ETL. The electron injecting layer EIL may use an inorganic material, and in this case, the upper layer 620 may be formed of a combination of an organic layer and an inorganic layer.

Referring again to FIG. 2, the second electrode 700 may be provided on the light emitting layer 600. The second electrode 700 may function as a cathode of the electroluminescent display apparatus. The second electrode 700 may be provided in each of the subpixels SP1 to SP3 and a boundary region therebetween. In a case where the electroluminescent display apparatus according to an aspect of the present disclosure is implemented as the top emission type, the second electrode 700 may include a transparent conductive material for transmitting light, emitted from the light emitting layer 600, toward an upper portion. Also, the second electrode 700 may be a semitransparent electrode, and thus, a micro-cavity effect may be obtained for each of the subpixels SP1 to SP3. That is, reflection and re-reflection of light may be repeated between the second electrode 700 including a semitransparent electrode and the first electrode 300 including a reflective electrode, and thus, the micro-cavity effect may be obtained, thereby enhancing light efficiency.

The encapsulation layer 800 may be provided on the second electrode 700 and may prevent external water from penetrating into the light emitting layer 600. The encapsulation layer 800 may be formed of an inorganic insulating material or may be formed in a structure where an inorganic insulating material and an organic insulating material are alternately stacked, but is not limited thereto.

Moreover, a capping layer may be further provided between the second electrode 700 and the encapsulation layer 800, thereby enhancing a light extraction effect.

Figure 4:
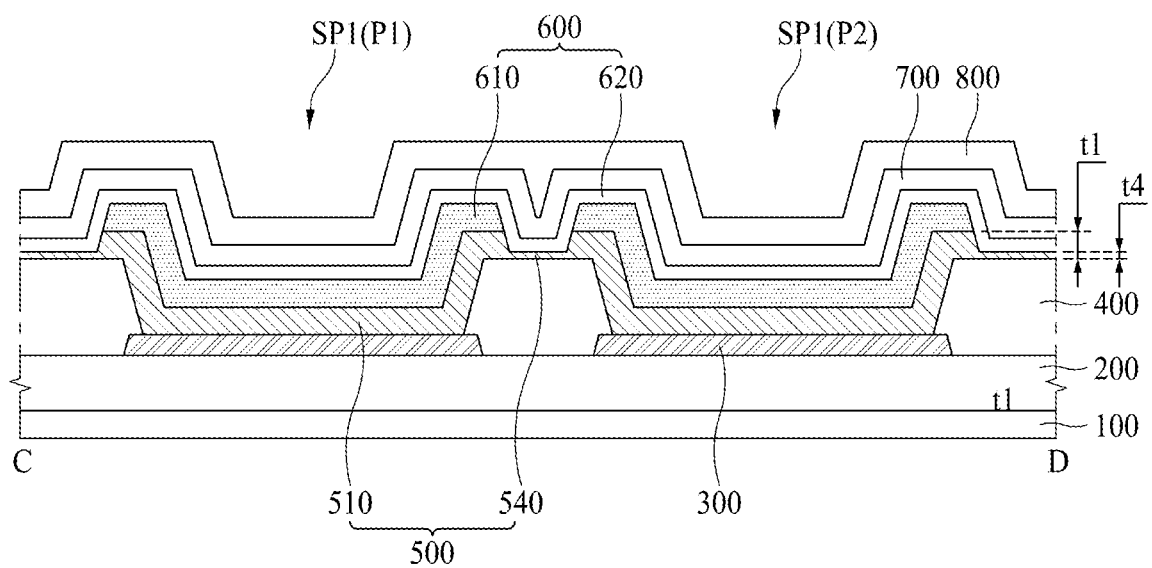
FIG. 4 is a cross-sectional view of an electroluminescent display apparatus according to an aspect of the present disclosure and is a cross-sectional view according to an aspect taken along line C-D of FIG. 1.

FIG. 4 is a cross-sectional view of an electroluminescent display apparatus according to an aspect of the present disclosure and is a cross-sectional view according to an aspect taken along line C-D of FIG. 1. Hereinafter, repetitive descriptions of the same elements as the above-described elements are omitted.

As seen in FIG. 4, a circuit device layer 200 may be provided on a substrate 100, and a first electrode 300 may be provided on the circuit device layer 200. The first electrode 300 may be patterned in each of a first subpixel SP1 of a first pixel P1 and a first subpixel SP1 of a second pixel P2.

A bank 400 covering an edge of the first electrode 300 may be provided on the circuit device layer 200, and a protection layer 500 may be provided on the bank 400 and an upper surface, uncovered by the bank 400, of the first electrode 300.

The protection layer 500 may include a first portion 510 and a fourth portion 540. The first portion 510 may be provided on an upper surface of the first electrode 300 of the first subpixel SP1 in each of the first pixel P1 and the second pixel P2 and may extend to a portion of an upper surface of the bank 400 along a side surface of the bank 400 adjacent to the first subpixel SP1. The fourth portion 540 may be provided on an upper surface of the bank 400 between the first subpixel SP1 of the first pixel P1 and the first subpixel SP1 of the second pixel P2. The first portion 510 may have a first thickness t1 which is relatively thick, the fourth portion 540 may have a fourth thickness t4 which is relatively thin, and the first portion 510 may be connected to the fourth portion 540.

A light emitting layer 600 including a lower layer 610 and an upper layer 620 may be provided on the protection layer 500. The lower layer 610 may be patterned in each of the first subpixel SP1 of the first pixel P1 and the first subpixel SP1 of the second pixel P2. The lower layer 610 provided in each of the first subpixel SP1 of the first pixel P1 and the first subpixel SP1 of the second pixel P2 may include a light emitting layer emitting light of a first color (for example, red). The lower layer 610 may overlap the first portion 510 of the protection layer 500 and may have the same pattern as that of the first portion 510. The upper layer 620 may also be provided in a boundary between the first subpixel SP1 of the first pixel P1 and the first subpixel SP1 of the second pixel P2. Accordingly, the upper layer 620 may be provided on an upper surface of the fourth portion 540 of the protection layer 500 and an upper surface of the lower layer 610 provided in the first subpixel SP1.

A second electrode 700 may be provided on the light emitting layer 600, and an encapsulation layer 800 may be provided on the second electrode 700.

FIGS. 5A to 5K are manufacturing process views of an electroluminescent display apparatus according to an aspect of the present disclosure and relate a process of manufacturing the above-described electroluminescent display apparatus of FIG. 2.

Figure 5A:
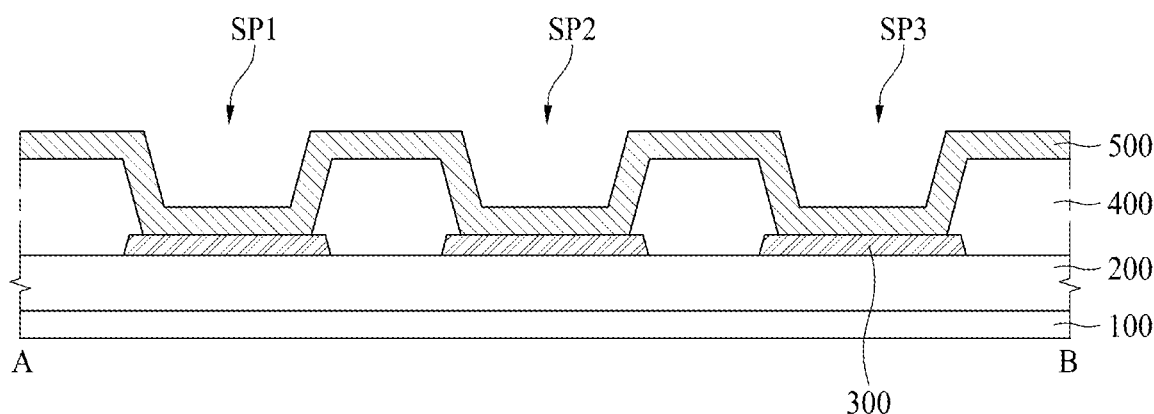
FIGS. 5A to 5K are manufacturing process views of an electroluminescent display apparatus according to an aspect of the present disclosure.

First, as seen in FIG. 5A, a circuit device layer 200 may be formed on a substrate 100, a first electrode 300 may be formed on the circuit device layer 200 in each of subpixels (for example, first to third subpixels) SP1 to SP3, and a bank 400 may be formed to cover an edge of the first electrode 300. Subsequently, a protection layer 500 may be formed on an upper surface of each of the first electrode 300 and the bank 400. The protection layer 500 may be formed to have a first thickness t1.

Figure 5B:
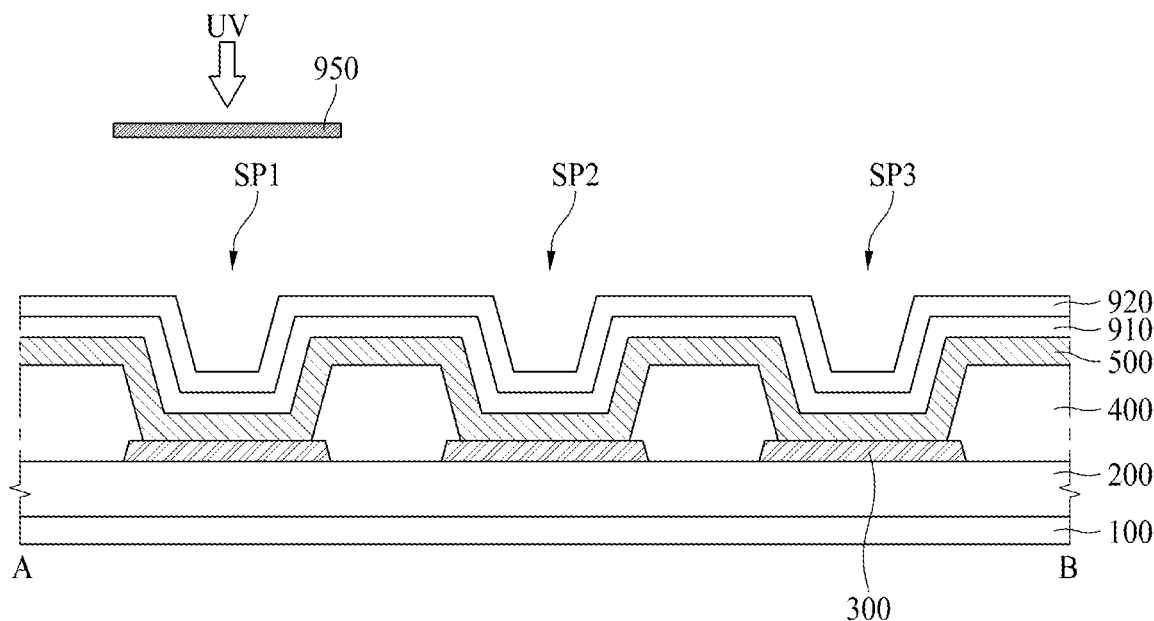

Subsequently, as seen in FIG. 5B, a shield layer 910 and a photoresist layer 920 may be sequentially formed on the protection layer 500, and then, light may be irradiated onto the photoresist layer 920 in a state where the first subpixel SP1 area is covered by a mask 950.

The shield layer 910 may be lifted off in a below-described process of FIG. 5E. The shield layer 910 may be additionally formed under the photoresist layer 920, and thus, the photoresist layer 920 may not remain in the liftoff process. The shield layer 910 may include a fluorine polymer, but is not limited thereto.

Figure 5C:
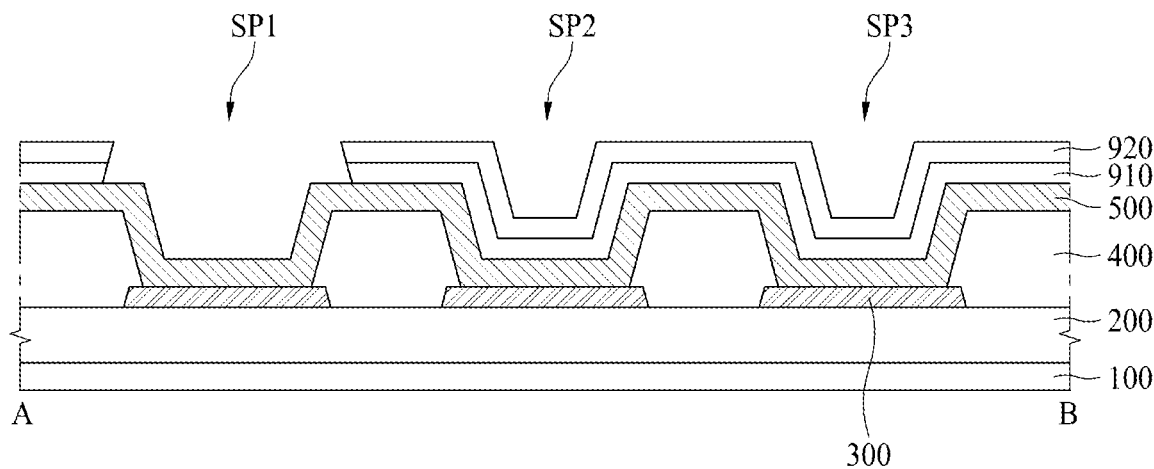

Subsequently, as seen in FIG. 5C, a development process may be performed on the shield layer 910 and the photoresist layer 920. Therefore, the shield layer 910 and the photoresist layer 920 may remain in a region (i.e., a light-irradiated region) uncovered by the mask 950, and the shield layer 910 and the photoresist layer 920 may be removed from in a region (i.e., a region onto which light is not irradiated) covered by the mask 950. The protection layer 500 of the first subpixel SP1 may be exposed by the development process.

Figure 5D:
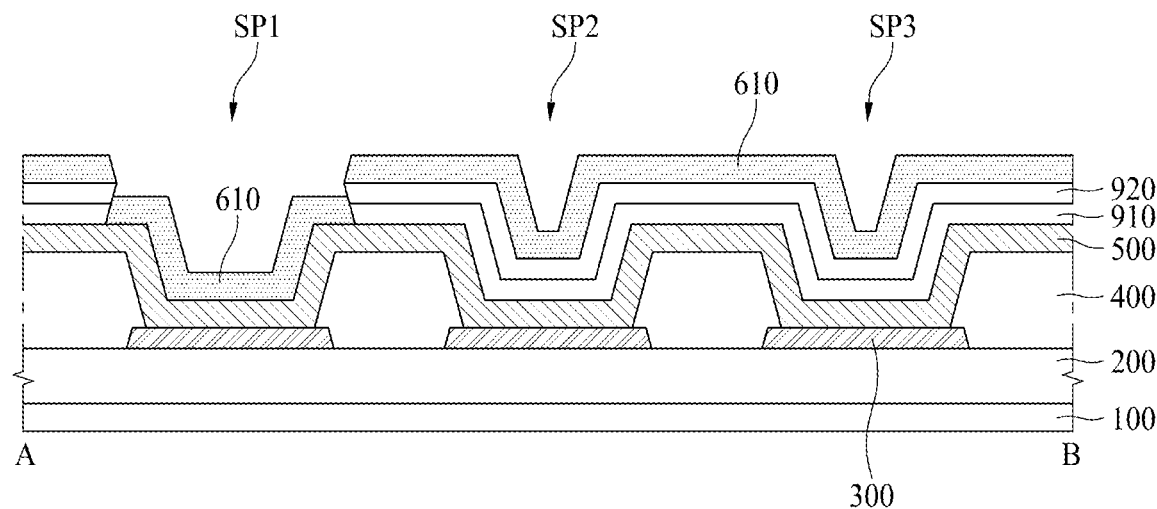

Subsequently, as seen in FIG. 5D, a lower layer 610 configuring the light emitting layer 600 may be formed on an upper surface of the exposed protection layer 500 of the first subpixel SP1 and an upper surface of the remaining photoresist layer 920. The lower layer 610 may be the same as the lower layer 610 of the first subpixel SP1 described above with reference to FIG. 3. That is, the lower layer 610 may be formed by sequentially stacking a hole injecting layer HIL, a hole transporting layer HTL, an electron blocking layer EBL, a red light emitting layer EML(R), and a hole blocking layer HBL.

Figure 5E:
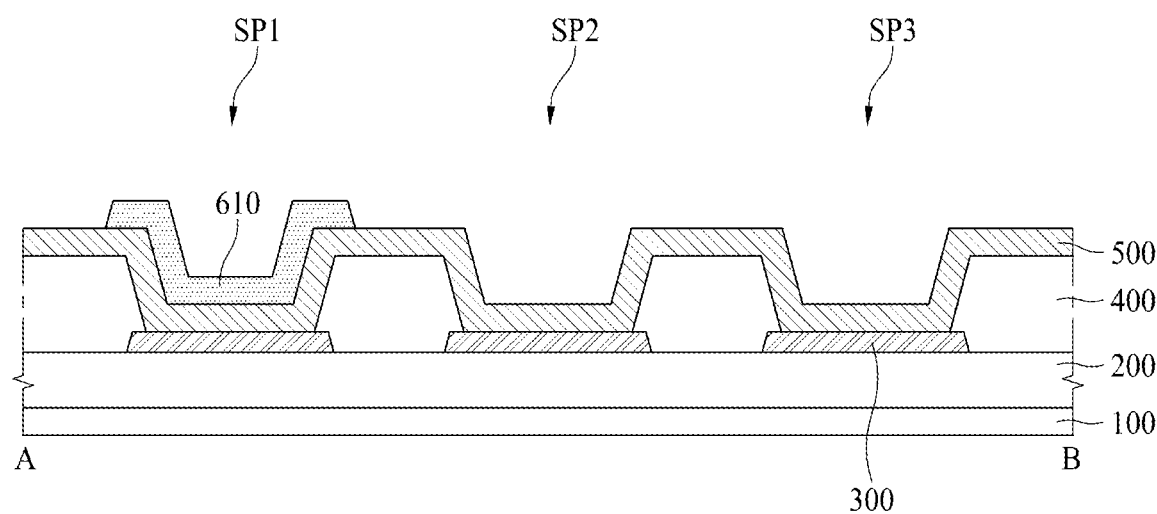

Subsequently, as seen in FIG. 5E, the shield layer 910, the photoresist layer 920, and the lower layer 610 each provided in the second subpixel SP2 area and the third subpixel SP3 area may be removed through a liftoff process. Therefore, the lower layer 610 configuring the light emitting layer 600 may remain in only the first subpixel SP1.

Figure 5F:
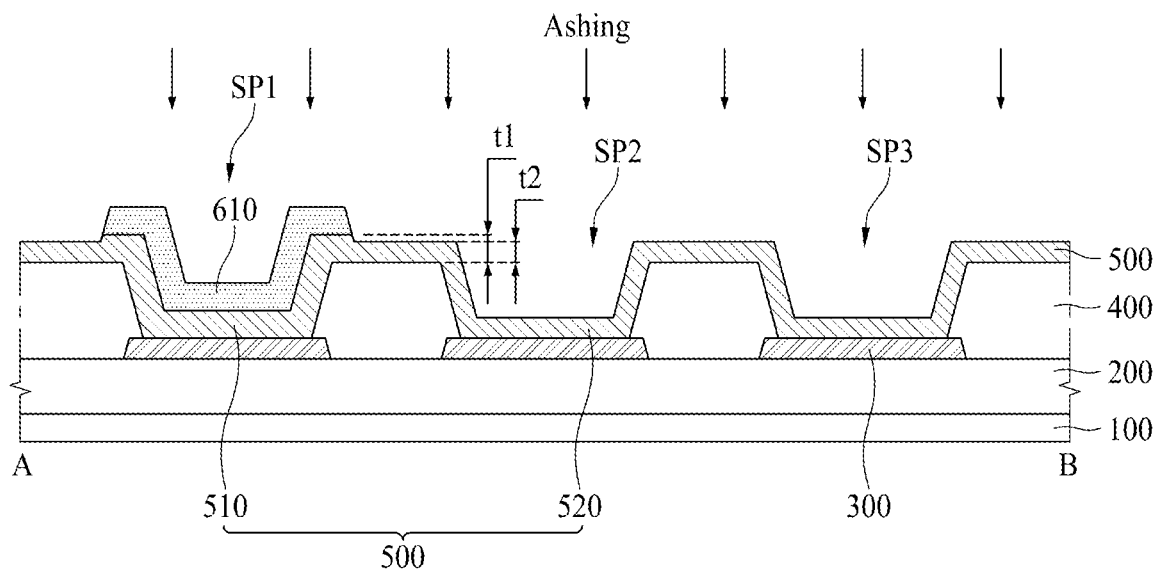
Figure 5G:
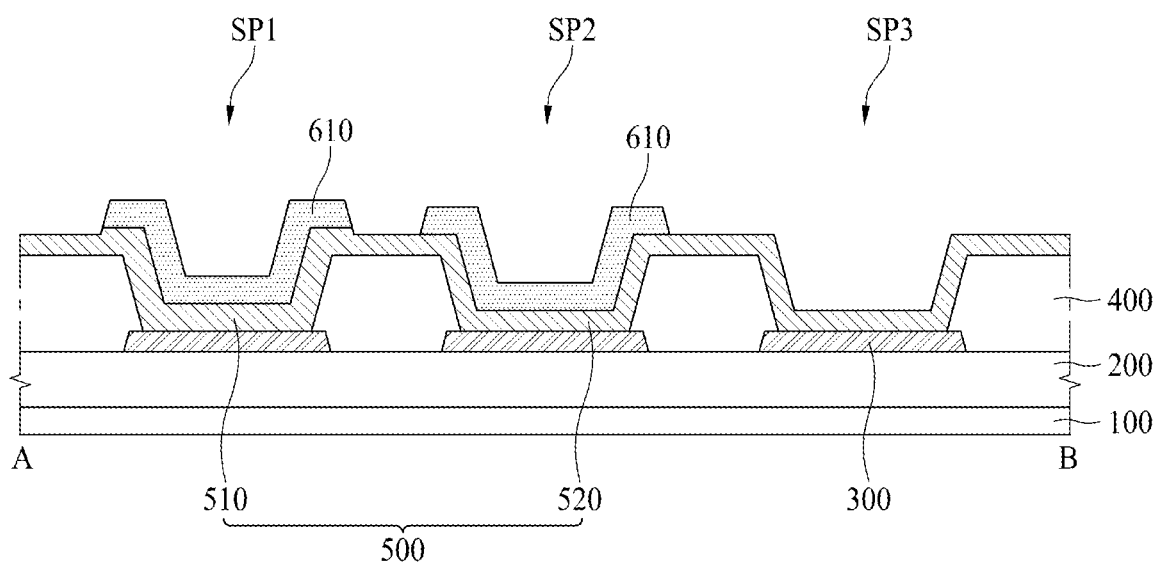

Subsequently, as seen in FIG. 5F, ashing may be performed on a front surface of the substrate 100. The ashing may completely remove the shield layer 910 remaining after the liftoff process.

When the ashing is performed, a thickness of the protection layer 500 may be reduced. The protection layer 500 may be covered by the lower layer 610 in the first subpixel SP1, but the protection layer 500 may be exposed in the second subpixel SP2 and the third subpixel SP3. Therefore, due to the ashing, a thickness of the protection layer 500 of the first subpixel SP1 may be maintained as the first thickness t1, but the protection layer 500 of each of the second subpixel SP2 and the third subpixel SP3 may have a second thickness t2 which is thinner than the first thickness t1.

In more detail, the protection layer 500 may have the first thickness t1 in an upper surface region of the first electrode 300 of the first subpixel SP1 and a region which extends to a portion of an upper surface of the bank 400 along a side surface of the bank 400 adjacent to the first subpixel SP1, and in the other region, the protection layer 500 may have the second thickness t2.

Subsequently, the above-described processes of FIGS. 5B to 5E may be repeated, and the mask 950 of FIG. 5B may move to the second subpixel SP3 and a stacked structure of the lower layer 610 of FIG. 5D may be configured identical to the lower layer 610 of the second subpixel SP2 in FIG. 3 described above. Therefore, as in FIG. 5G, the lower layer 610 configuring the light emitting layer 600 may remain in only the second subpixel SP2.

Figure 5H:
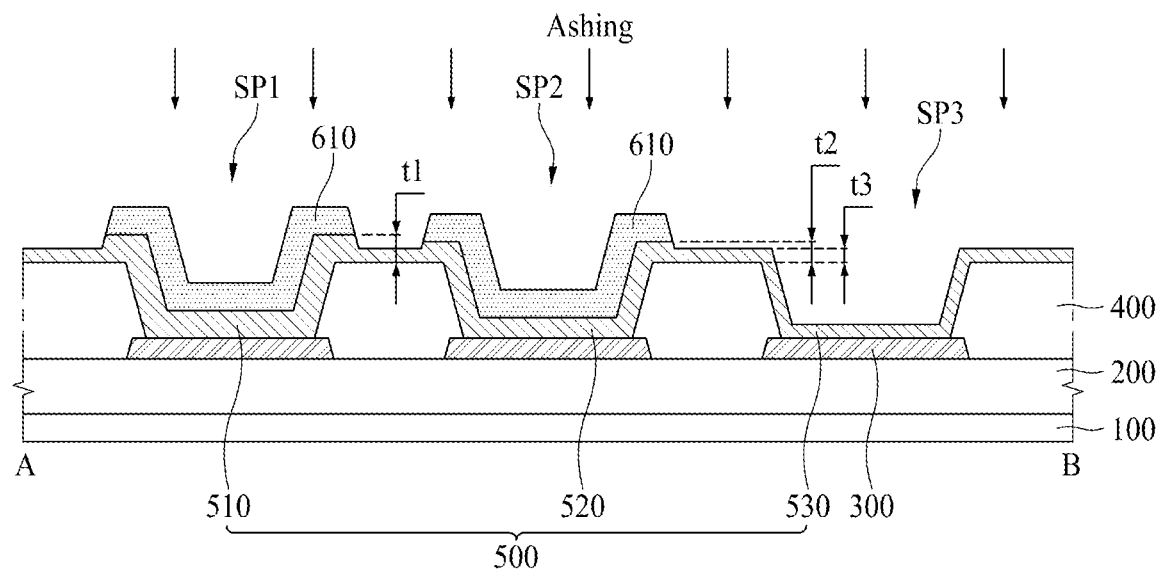
Figure 5I:
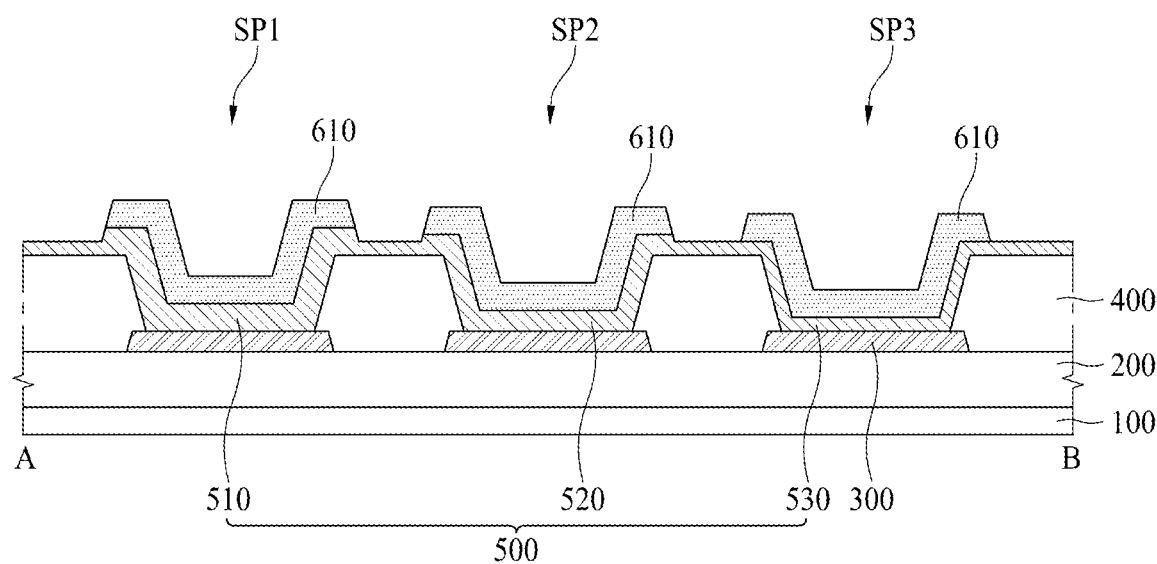

Subsequently, as seen in FIG. 5H, ashing may be performed on the front surface of the substrate 100. When the ashing is performed, a thickness of the protection layer 500 may be reduced. The protection layer 500 may be covered by the lower layer 610 in the first subpixel SP1 and the second subpixel SP2, but the protection layer 500 may be exposed in the third subpixel SP3 and a boundary between the subpixels SP1 to SP3. Therefore, due to the ashing, a thickness of the protection layer 500 of the first subpixel SP1 may be maintained as the first thickness t1 and a thickness of the protection layer 500 of the second subpixel SP2 may be maintained as the second thickness t2, but a thickness of the protection layer 500 in the third subpixel SP3 and a boundary region between the subpixels SP1 to SP3 may have a third thickness t3 which is thinner than the second thickness t2.

In more detail, the protection layer 500 may have the first thickness t1 in the upper surface region of the first electrode 300 of the first subpixel SP1 and the region which extends to the portion of the upper surface of the bank 400 along the side surface of the bank 400 adjacent to the first subpixel SP1, the protection layer 500 may have the second thickness t2 in an upper surface region of the first electrode 300 of the second subpixel SP2 and a region which extends to a portion of an upper surface of the bank 400 along a side surface of the bank 400 adjacent to the second subpixel SP2, and in the other region, the protection layer 500 may have the third thickness t3.

Subsequently, the above-described processes of FIGS. 5B to 5E may be repeated, and the mask 950 of FIG. 5B may move to the third subpixel SP3 and a stacked structure of the lower layer 610 of FIG. 5D may be configured identical to the lower layer 610 of the third subpixel SP3 in FIG. 3 described above. Therefore, as in FIG. 5I, the lower layer 610 configuring the light emitting layer 600 may remain in only the third subpixel SP3.

Figure 5J:
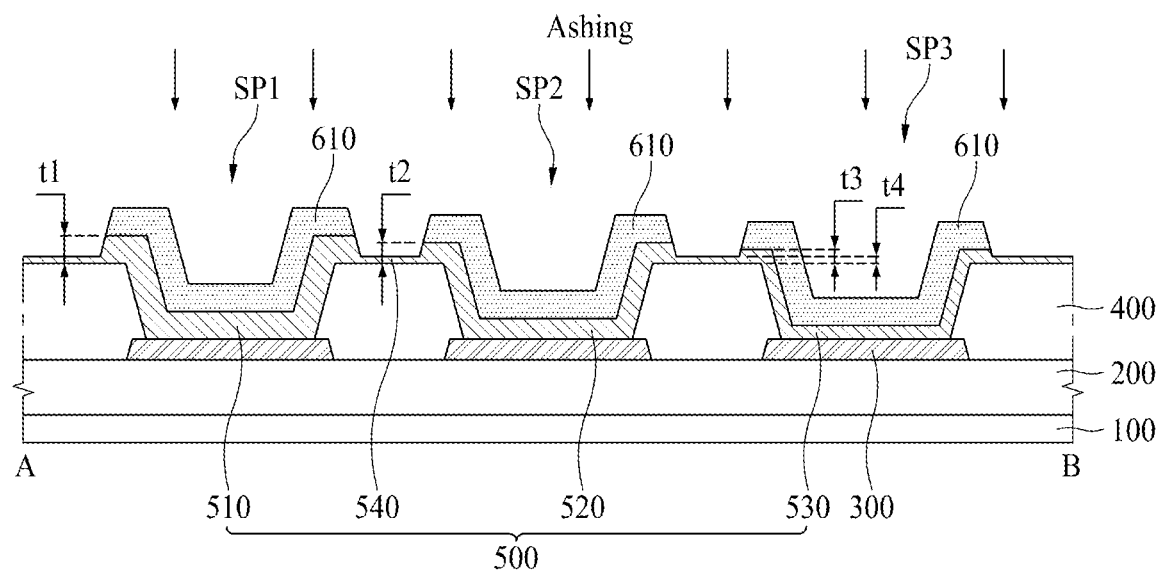

Subsequently, as seen in FIG. 5J, ashing may be performed on the front surface of the substrate 100. When the ashing is performed, a thickness of the protection layer 500 may be reduced. The protection layer 500 may be covered by the lower layer 610 in the first subpixel SP1, the second subpixel SP2, and the third subpixel SP3, but the protection layer 500 may be exposed in the boundary between the subpixels SP1 to SP3. Therefore, due to the ashing, a thickness of the protection layer 500 of the first subpixel SP1 may be maintained as the first thickness t1, a thickness of the protection layer 500 of the second subpixel SP2 may be maintained as the second thickness t2, and a thickness of the protection layer 500 of the third subpixel SP3 may be maintained as the third thickness t3, but a thickness of the protection layer 500 in the boundary region between the subpixels SP1 to SP3 may have a fourth thickness t4 which is thinner than the third thickness t3.

In more detail, the protection layer 500 may have the first thickness t1 in the upper surface region of the first electrode 300 of the first subpixel SP1 and the region which extends to the portion of the upper surface of the bank 400 along the side surface of the bank 400 adjacent to the first subpixel SP1, the protection layer 500 may have the second thickness t2 in the upper surface region of the first electrode 300 of the second subpixel SP2 and the region which extends to the portion of the upper surface of the bank 400 along the side surface of the bank 400 adjacent to the second subpixel SP2, the protection layer 500 may have the third thickness t3 in an upper surface region of the first electrode 300 of the third subpixel SP3 and a region which extends to a portion of an upper surface of the bank 400 along a side surface of the bank 400 adjacent to the third subpixel SP3, and in the other region (i.e., the boundary region between the subpixels SP1 to SP3), the protection layer 500 may have the fourth thickness t4.

Therefore, the protection layer 500 including a first portion 510 having the first thickness t1, a second portion 520 having the second thickness t2, a third portion 530 having the third thickness t3, and a fourth portion 540 having the fourth thickness t4 may be formed.

Figure 5K:
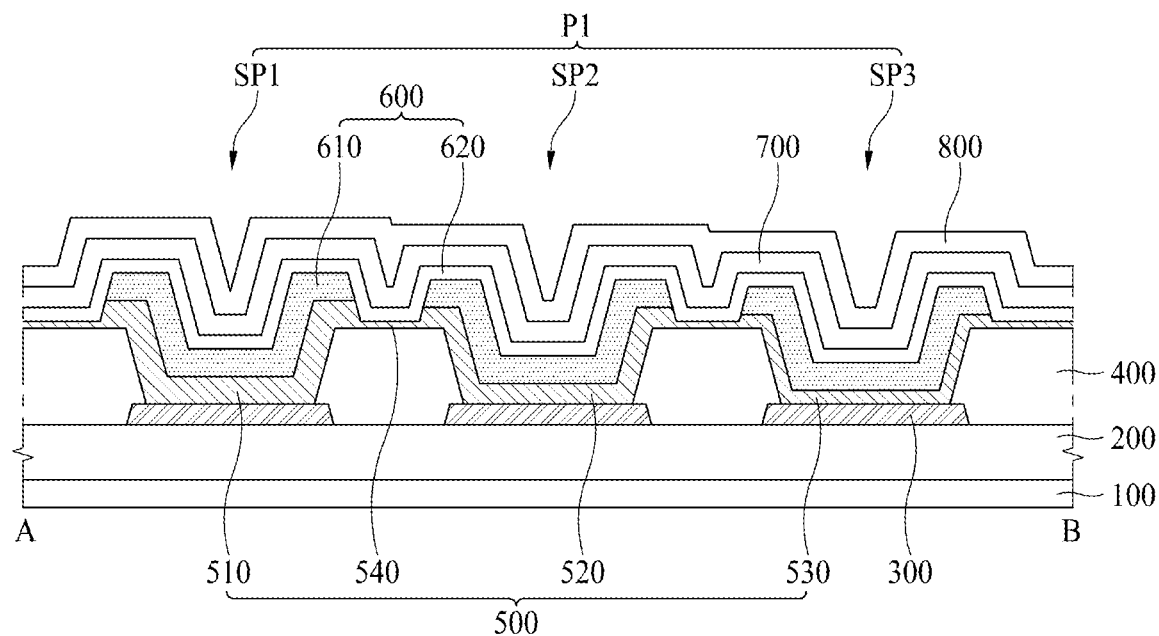

Subsequently, as seen in FIG. 5K, an upper layer 620 may be formed on an upper surface of the fourth portion 540 of the protection layer 500 in the boundary region between the subpixels SP1 to SP3 and an upper surface of the lower layer 610 provided in each of the subpixels SP1 to SP3, and the light emitting layer 600 including the lower layer 610 and the upper layer 620 may be formed.

Subsequently, a second electrode 700 may be formed on the upper layer 620 of the light emitting layer 600, and an encapsulation layer 800 may be formed on the second electrode 700.

As described above, according to an aspect of the present disclosure, lower layers 610 of light emitting layers 600 emitting lights of different colors may be respectively patterned in the subpixels SP1 to SP3 by using the shield layer 910 and the photoresist layer 920, and thus, the lower layers 610 of the light emitting layers 600 may be precisely patterned in the subpixels SP1 to SP3 which are densely arranged.

Particularly, according to an aspect of the present disclosure, the protection layer 500 may be additionally formed under the shield layer 910, and thus, the first electrode 300 and the bank 400 may be protected in a process of removing the shield layer 910 and the photoresist layer 920 through a liftoff process and additionally removing the remaining shield layer 910 through the ashing.

Figure 6:
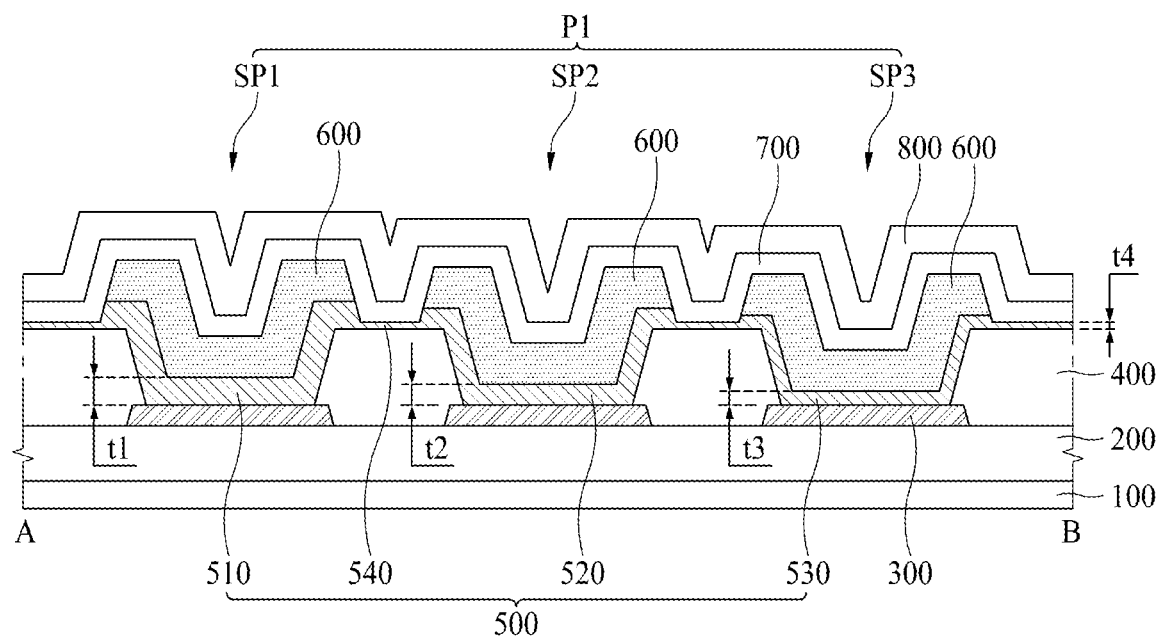
FIG. 6 is a cross-sectional view of an electroluminescent display apparatus according to another aspect of the present disclosure and is a cross-sectional view according to another aspect taken along line A-B of FIG. 1.

FIG. 6 is a cross-sectional view of an electroluminescent display apparatus according to another aspect of the present disclosure and is a cross-sectional view according to another aspect taken along line A-B of FIG. 1. Except for that a configuration of a light emitting layer 600 is changed, the electroluminescent display apparatus of FIG. 6 is the same as the electroluminescent display apparatus of FIG. 2. Therefore, like reference numerals refer to like elements. Hereinafter, only different elements will be described.

According to FIG. 2 described above, the light emitting layer 600 may include the lower layer 610 patterned in each of the subpixels SP1 to SP3 and the upper layer 620 provided as one body in each of the subpixels SP1 to SP3 and the boundary between the subpixels SP1 to SP3.

Unlike FIG. 2, according to FIG. 6, all of the light emitting layers 600 may be respectively patterned in the subpixels SP1 to SP3. That is, a light emitting layer 600 emitting light of a first color (for example, red) may be patterned in the first subpixel SP1, a light emitting layer 600 emitting light of a second color (for example, green) may be patterned in the second subpixel SP2, and a light emitting layer 600 emitting light of a third color (for example, blue) may be patterned in the third subpixel SP3.

The light emitting layer 600 of the first subpixel SP1 may overlap the first portion 510 of the protection layer 500 and may have the same pattern as that of the first portion 510. That is, one end and the other end of the light emitting layer 600 of the first subpixel SP1 may match one end and the other end of the first portion 510. Also, the light emitting layer 600 of the second subpixel SP2 may overlap the second portion 520 of the protection layer 500 and may have the same pattern as that of the second portion 520. That is, one end and the other end of the light emitting layer 600 of the second subpixel SP2 may match one end and the other end of the second portion 520. Also, the light emitting layer 600 of the third subpixel SP3 may overlap the third portion 530 of the protection layer 500 and may have the same pattern as that of the third portion 530. That is, one end and the other end of the light emitting layer 600 of the third subpixel SP3 may match one end and the other end of the third portion 530. Accordingly, the light emitting layer 600 of the first subpixel SP1, the light emitting layer 600 of the second subpixel SP2, and the light emitting layer 600 of the third subpixel SP3 may be spaced apart from one another with the fourth portion 540 of the protection layer 500 therebetween.

A configuration of the light emitting layer 600 will be described below with reference to FIG. 7.

Figure 7:
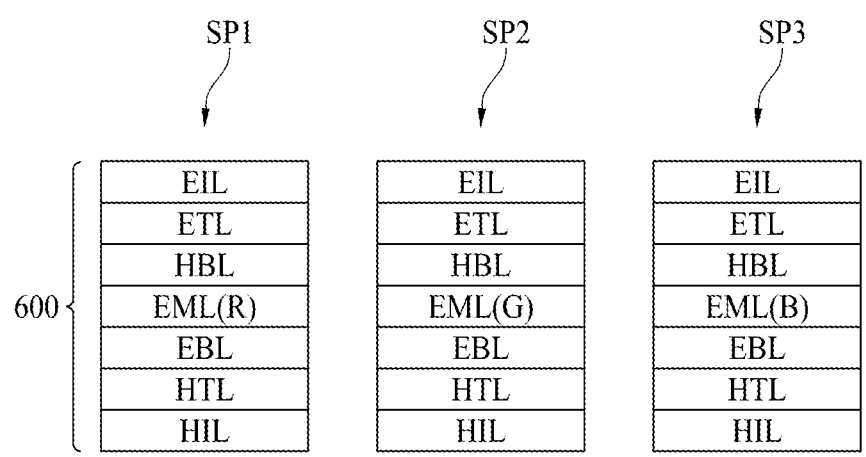
FIG. 7 is a schematic cross-sectional view illustrating a structure of a light emitting layer according to another aspect of the present disclosure.

FIG. 7 is a schematic cross-sectional view illustrating a structure of a light emitting layer according to another aspect of the present disclosure. As seen in FIG. 7, a plurality of light emitting layers 600 may be respectively patterned in subpixels (for example, first to third subpixels) SP1 to SP3 and may be spaced apart from one another.

A light emitting layer 600 of the first subpixel SP1 may be formed of a plurality of organic layers, and in detail, may be provided in a structure where a hole injecting layer HIL, a hole transporting layer HTL, an electron blocking layer EBL, a red light emitting layer EML(R), a hole blocking layer HBL, an electron transporting layer ETL, and an electron injecting layer EIL are sequentially stacked.

A light emitting layer 600 of the second subpixel SP2 may be formed of a plurality of organic layers, and in detail, may be provided in a structure where a hole injecting layer HIL, a hole transporting layer HTL, an electron blocking layer EBL, a green light emitting layer EML(G), a hole blocking layer HBL, an electron transporting layer ETL, and an electron injecting layer EIL are sequentially stacked.

A light emitting layer 600 of the third subpixel SP3 may be formed of a plurality of organic layers, and in detail, may be provided in a structure where a hole injecting layer HIL, a hole transporting layer HTL, an electron blocking layer EBL, a blue light emitting layer EML(B), a hole blocking layer HBL, an electron transporting layer ETL, and an electron injecting layer EIL are sequentially stacked.

Detailed configurations of the organic layers of each of the light emitting layers 600 are as described above with reference to FIG. 3, and thus, their repetitive descriptions are omitted.

Figure 8:
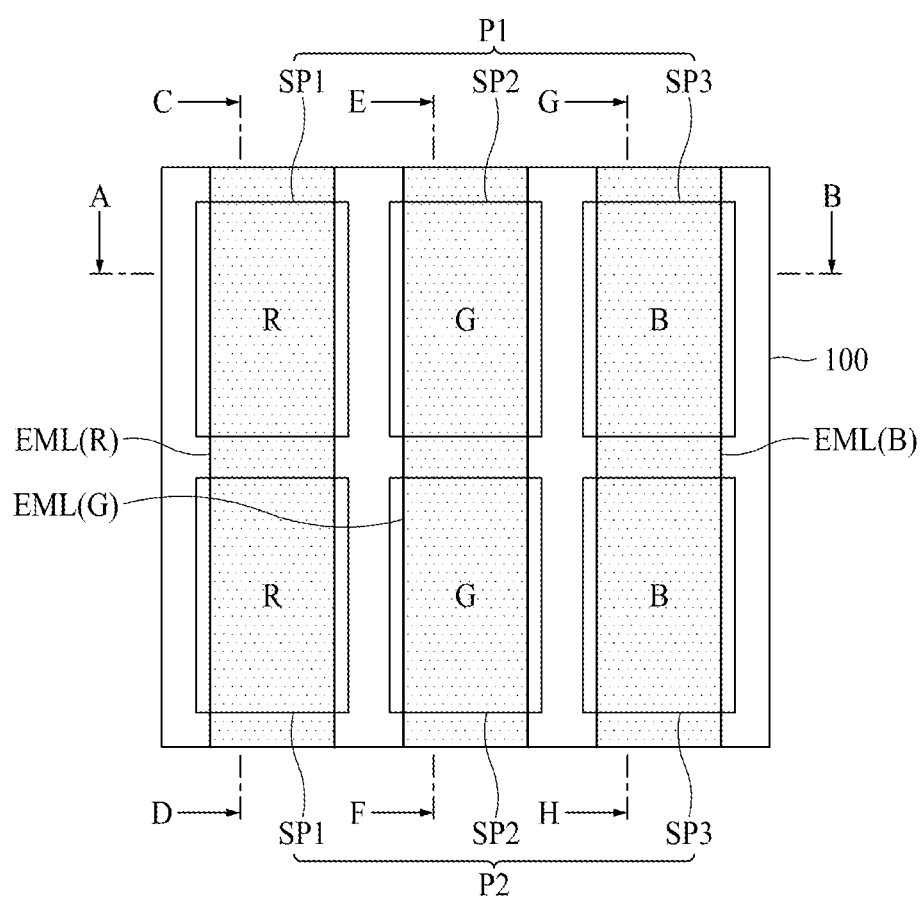
FIG. 8 is a schematic plan view of an electroluminescent display apparatus according to another aspect of the present disclosure.

FIG. 8 is a schematic plan view of an electroluminescent display apparatus according to another aspect of the present disclosure. Except for that a configuration of a light emitting layer is changed, the electroluminescent display apparatus of FIG. 8 is the same as the electroluminescent display apparatus of FIG. 1. Hereinafter, therefore, only different elements will be described.

According to FIG. 1 described above, a red light emitting layer EML(R) included in a first subpixel SP1 of a first pixel P1 may be spaced apart from a red light emitting layer EML(R) included in a first subpixel SP1 of a second pixel P2, a green light emitting layer EML(G) included in a second subpixel SP2 of the first pixel P1 may be spaced apart from a green light emitting layer EML(G) included in a second subpixel SP2 of the second pixel P2, and a blue light emitting layer EML(B) included in a third subpixel SP3 of the first pixel P1 may be spaced apart from a blue light emitting layer EML(B) included in a third subpixel SP3 of the second pixel P2.

Unlike FIG. 1, according to FIG. 8, the red light emitting layer EML(R) included in the first subpixel SP1 of the first pixel P1 may be connected to the red light emitting layer EML(R) included in the first subpixel SP1 of the second pixel P2. That is, a red light emitting layer EML(R) may be provided in a boundary region between the first pixel P1 and the second pixel P2. Also, the green light emitting layer EML(G) included in the second subpixel SP2 of the first pixel P1 may be connected to the green light emitting layer EML(G) included in the second subpixel SP2 of the second pixel P2. That is, a green light emitting layer EML(G) may be provided in the boundary region between the first pixel P1 and the second pixel P2. Also, the blue light emitting layer EML(B) included in the third subpixel SP3 of the first pixel P1 may be connected to the blue light emitting layer EML(B) included in the third subpixel SP3 of the second pixel P2. That is, a blue light emitting layer EML(B) may be provided in the boundary region between the first pixel P1 and the second pixel P2.

In this manner, according to FIG. 8, the red light emitting layer EML(R), the green light emitting layer EML(G), and the blue light emitting layer EML(B) may alternately extend in a first direction (for example, a vertical direction), and thus, the light emitting layers EML(R), EML(G), and EML(B) may be wholly provided in a stripe structure.

Figure 9:
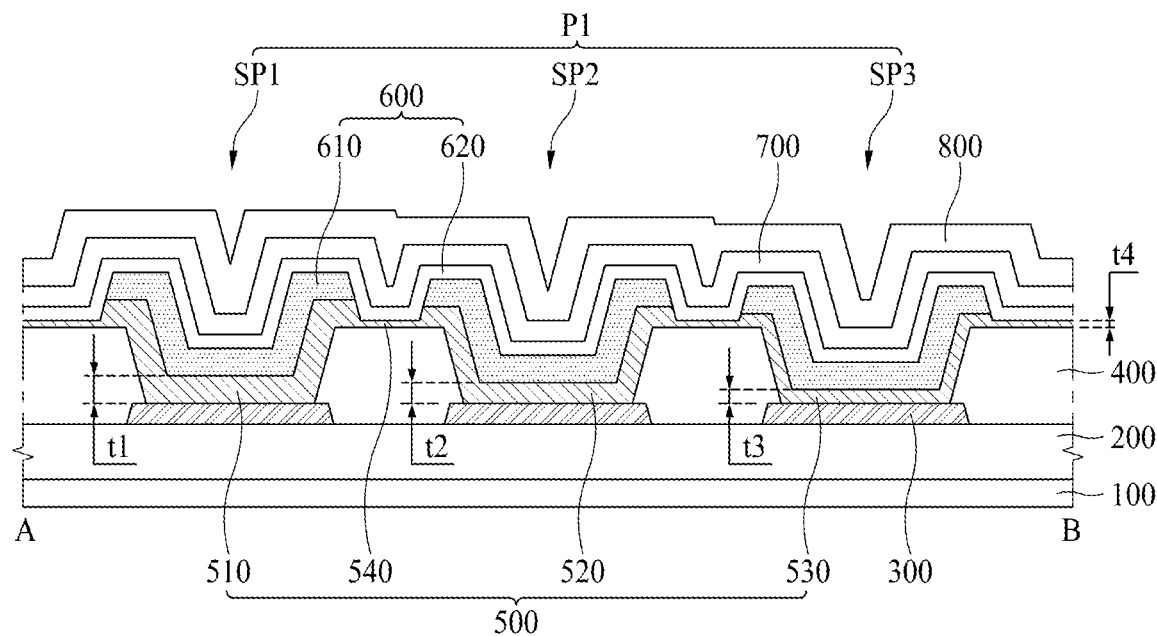
FIG. 9 is a cross-sectional view of an electroluminescent display apparatus according to another aspect of the present disclosure and is a cross-sectional view according to an aspect taken along line A-B of FIG. 8.

FIG. 9 is a cross-sectional view of an electroluminescent display apparatus according to another aspect of the present disclosure and is a cross-sectional view according to an aspect taken along line A-B of FIG. 8.

A cross-sectional surface taken along line A-B of FIG. 8 may be the same as a cross-sectional surface taken along line A-B of FIG. 1, and thus, FIG. 9 may be the same as FIG. 2 described above. Therefore, a repetitive description of FIG. 9 is omitted.

Although not shown, a structure of a light emitting layer 600 of FIG. 9 may be changed to the structure of the light emitting layer 600 of FIG. 6 or 7 described above.

Figure 10A:
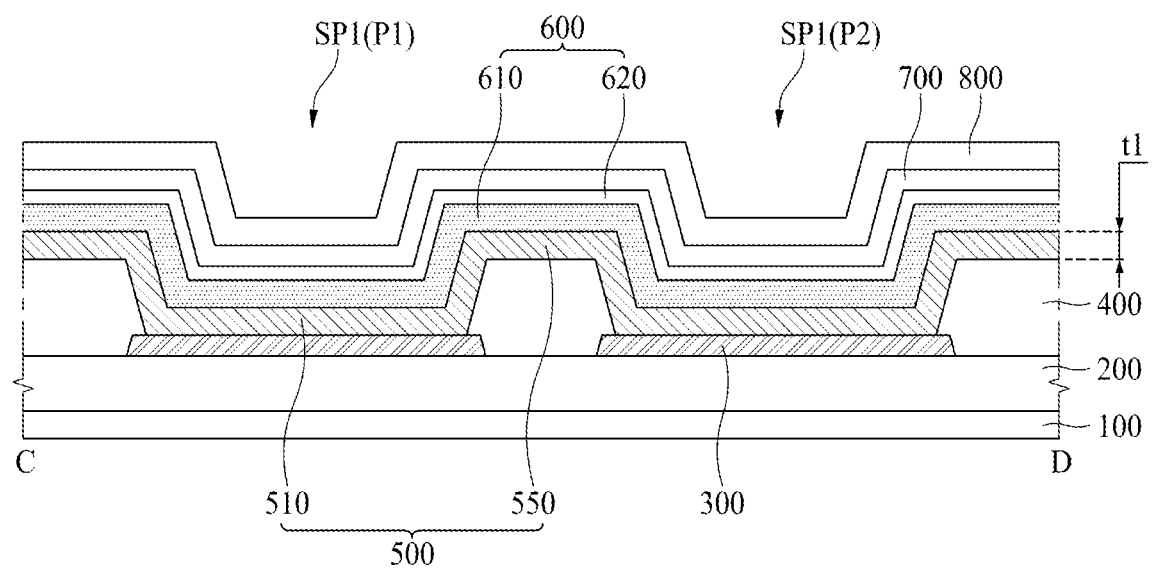
FIGS. 10A to 10C are manufacturing process views of an electroluminescent display apparatus according to an aspect of the present disclosure.
Figure 10B:
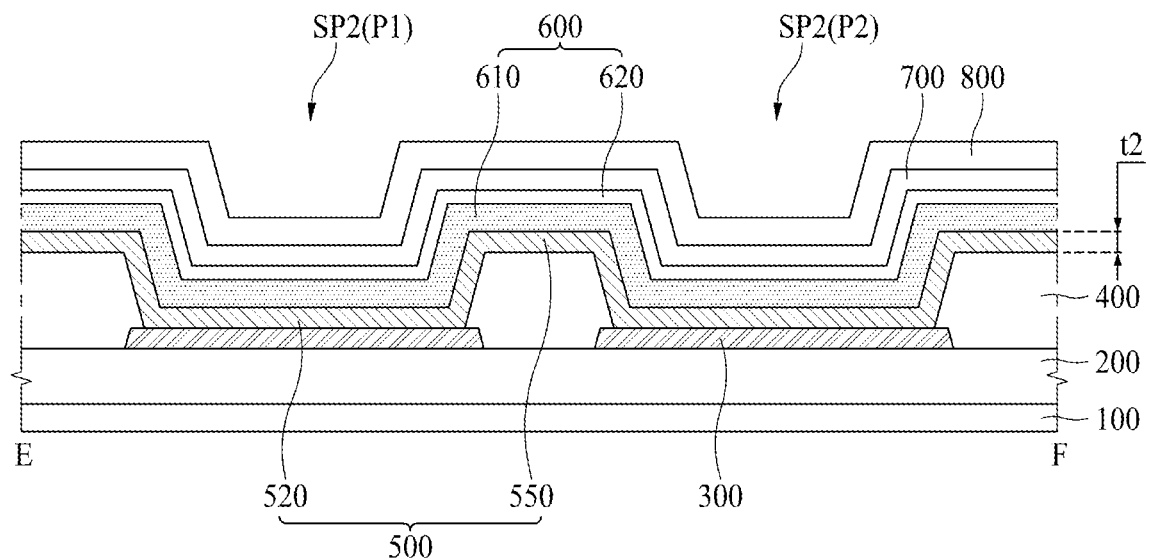
Figure 10C:
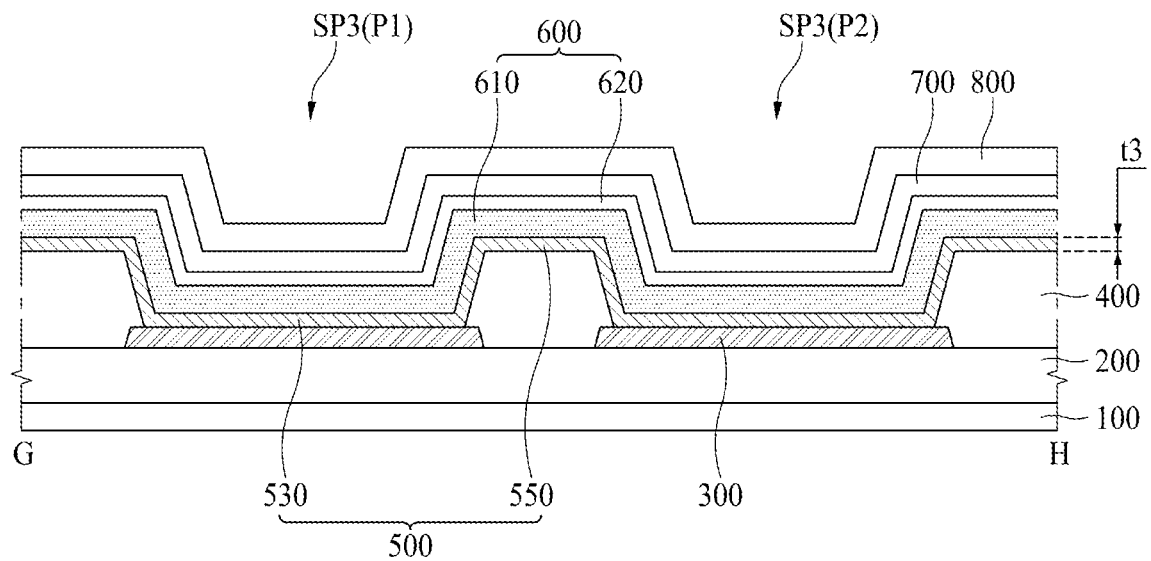

FIGS. 10A to 10C are manufacturing process views of an electroluminescent display apparatus according to an aspect of the present disclosure, FIG. 10A is a cross-sectional view according to an aspect taken along line C-D of FIG. 8, FIG. 10B is a cross-sectional view according to an aspect taken along line E-F of FIG. 8, and FIG. 10C is a cross-sectional view according to an aspect taken along line G-H of FIG. 8.

First, to describe line C-D of FIG. 8 with reference to FIG. 10A, a circuit device layer 200 may be formed on a substrate 100, and a first electrode 300 may be formed on the circuit device layer 200. The first electrode 300 may be patterned in each of a first subpixel SP1 of a first pixel P1 and a first subpixel SP1 of a second pixel P2.

A bank 400 covering an edge of the first electrode 300 may be provided on the circuit device layer 200, and a protection layer 500 may be provided on the bank 400 and an upper surface, uncovered by the bank 400, of the first electrode 300.

The protection layer 500 may include a first portion 510 and a fifth portion 550.

The first portion 510 may be a portion which overlaps each of the first subpixel SP1 of the first pixel P1 and the first subpixel SP1 of the second pixel P2, and the fifth portion 550 may be a portion which overlaps a boundary region between the first subpixel SP1 of the first pixel P1 and the first subpixel SP1 of the second pixel P2.

The first portion 510 may extend from an upper surface of the first electrode 300 of the first subpixel SP1 to a portion of an upper surface of the bank 400 along a side surface of the bank 400 adjacent to the first subpixel SP1. The fifth portion 550 may be provided on an upper surface of the bank 400 between the first subpixel SP1 of the first pixel P1 and the first subpixel SP1 of the second pixel P2. The first portion 510 may be connected to the fifth portion 550.

The first portion 510 and the fifth portion 550 may be provided to have the same thickness (in detail, a first thickness t1).

A light emitting layer 600 including a lower layer 610 and an upper layer 620 may be provided on the protection layer 500. The lower layer 610 may be provided on a whole upper surface of each of the first portion 510 and the fifth portion 550. That is, the lower layer 610 may be provided as one body in the first subpixel SP1 area of the first pixel P1, the first subpixel SP1 area of the second pixel P2, and the boundary region between the first subpixel SP1 of the first pixel P1 and the first subpixel SP1 of the second pixel P2. The lower layer 610 may include a light emitting layer emitting light of a first color (for example, red). Also, the upper layer 620 may be provided on a whole upper surface of the lower layer 610.

A second electrode 700 may be provided on the light emitting layer 600, and an encapsulation layer 800 may be provided on the second electrode 700.

Next, to describe line E-F of FIG. 8 with reference to FIG. 10B, a circuit device layer 200 may be formed on a substrate 100, and a first electrode 300 may be formed on the circuit device layer 200. The first electrode 300 may be patterned in each of a second subpixel SP2 of a first pixel P1 and a second subpixel SP2 of a second pixel P2.

A bank 400 covering an edge of the first electrode 300 may be provided on the circuit device layer 200, and a protection layer 500 may be provided on the bank 400 and an upper surface, uncovered by the bank 400, of the first electrode 300.

The protection layer 500 may include a second portion 520 and a fifth portion 550.

The second portion 520 may be a portion which overlaps each of the second subpixel SP2 of the first pixel P1 and the second subpixel SP2 of the second pixel P2, and the fifth portion 550 may be a portion which overlaps a boundary region between the second subpixel SP2 of the first pixel P1 and the second subpixel SP2 of the second pixel P2.

The second portion 520 may extend from an upper surface of the first electrode 300 of the second subpixel SP2 to a portion of an upper surface of the bank 400 along a side surface of the bank 400 adjacent to the second subpixel SP2. The fifth portion 550 may be provided on an upper surface of the bank 400 between the second subpixel SP2 of the first pixel P1 and the second subpixel SP2 of the second pixel P2. The second portion 520 may be connected to the fifth portion 550.

The second portion 520 and the fifth portion 550 may be provided to have the same thickness (in detail, a second thickness t2).

A light emitting layer 600 including a lower layer 610 and an upper layer 620 may be provided on the protection layer 500. The lower layer 610 may be provided on a whole upper surface of each of the second portion 520 and the fifth portion 550. That is, the lower layer 610 may be provided as one body in the second subpixel SP2 area of the first pixel P1, the second subpixel SP2 area of the second pixel P2, and the boundary region between the second subpixel SP2 of the first pixel P1 and the second subpixel SP2 of the second pixel P2. The lower layer 610 may include a light emitting layer emitting light of a second color (for example, green). Also, the upper layer 620 may be provided on a whole upper surface of the lower layer 610.

A second electrode 700 may be provided on the light emitting layer 600, and an encapsulation layer 800 may be provided on the second electrode 700.

Next, to describe line G-H of FIG. 8 with reference to FIG. 10C, a circuit device layer 200 may be formed on a substrate 100, and a first electrode 300 may be formed on the circuit device layer 200. The first electrode 300 may be patterned in each of a third subpixel SP3 of a first pixel P1 and a third subpixel SP3 of a second pixel P2.

A bank 400 covering an edge of the first electrode 300 may be provided on the circuit device layer 200, and a protection layer 500 may be provided on the bank 400 and an upper surface, uncovered by the bank 400, of the first electrode 300.

The protection layer 500 may include a third portion 530 and a fifth portion 550.

The third portion 530 may be a portion which overlaps each of the third subpixel SP3 of the first pixel P1 and the third subpixel SP3 of the second pixel P2, and the fifth portion 550 may be a portion which overlaps a boundary region between the third subpixel SP3 of the first pixel P1 and the third subpixel SP3 of the second pixel P2.

The third portion 530 may extend from an upper surface of the first electrode 300 of the third subpixel SP3 to a portion of an upper surface of the bank 400 along a side surface of the bank 400 adjacent to the third subpixel SP3. The fifth portion 550 may be provided on an upper surface of the bank 400 between the third subpixel SP3 of the first pixel P1 and the third subpixel SP3 of the second pixel P2. The third portion 530 may be connected to the fifth portion 550.

The third portion 530 and the fifth portion 550 may be provided to have the same thickness (in detail, a third thickness t3).

A light emitting layer 600 including a lower layer 610 and an upper layer 620 may be provided on the protection layer 500. The lower layer 610 may be provided on a whole upper surface of each of the third portion 530 and the fifth portion 550. That is, the lower layer 610 may be provided as one body in the third subpixel SP3 area of the first pixel P1, the third subpixel SP3 area of the second pixel P2, and the boundary region between the third subpixel SP3 of the first pixel P1 and the third subpixel SP3 of the second pixel P2. The lower layer 610 may include a light emitting layer emitting light of a third color (for example, blue). Also, the upper layer 620 may be provided on a whole upper surface of the lower layer 610.

A second electrode 700 may be provided on the light emitting layer 600, and an encapsulation layer 800 may be provided on the second electrode 700.

As described above, according to FIGS. 10A to 10C, a thickness of the fifth portion 550 overlapping the boundary region between the first subpixel SP1 of the first pixel P1 and the first subpixel SP1 of the second pixel P2 may be the same as that of the first portion 510, a thickness of the fifth portion 550 overlapping the boundary region between the second subpixel SP2 of the first pixel P1 and the second subpixel SP2 of the second pixel P2 may be the same as that of the second portion 520, and a thickness of the fifth portion 550 overlapping the boundary region between the third subpixel SP3 of the first pixel P1 and the third subpixel SP3 of the second pixel P2 may be the same as that of the third portion 530.

On the other hand, in the electroluminescent display apparatus illustrated in each of FIGS. 1 to 4 described above, a thickness of the protection layer 500 overlapping the boundary region between the first subpixel SP1 of the first pixel P1 and the first subpixel SP1 of the second pixel P2, a thickness of the protection layer 500 overlapping the boundary region between the second subpixel SP2 of the first pixel P1 and the second subpixel SP2 of the second pixel P2, and a thickness of the protection layer 500 overlapping the boundary region between the third subpixel SP3 of the first pixel P1 and the third subpixel SP3 of the second pixel P2 may each be the same as a thickness (i.e., a fourth thickness t4) of the fourth portion 540 overlapping the boundary region between the subpixels SP1 to SP3.

Figure 11A:
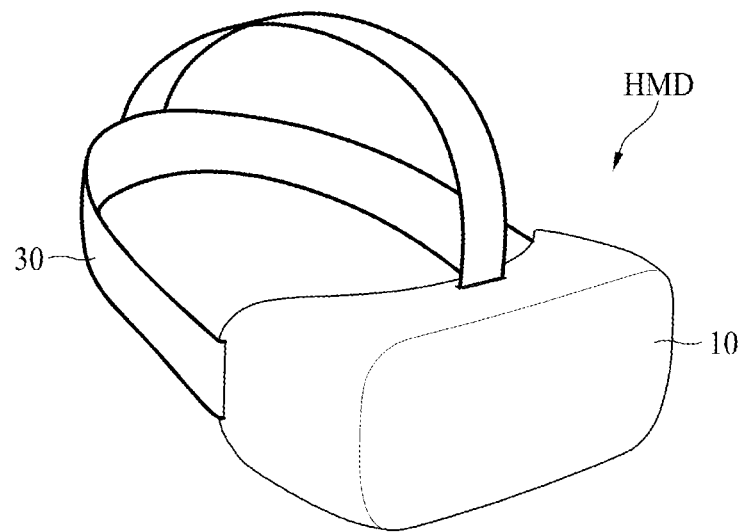
FIGS. 11A to 11C relate to an electroluminescent display apparatus according to another aspect of the present disclosure and relate to a head-mounted display (HMD) apparatus.
Figure 11B:
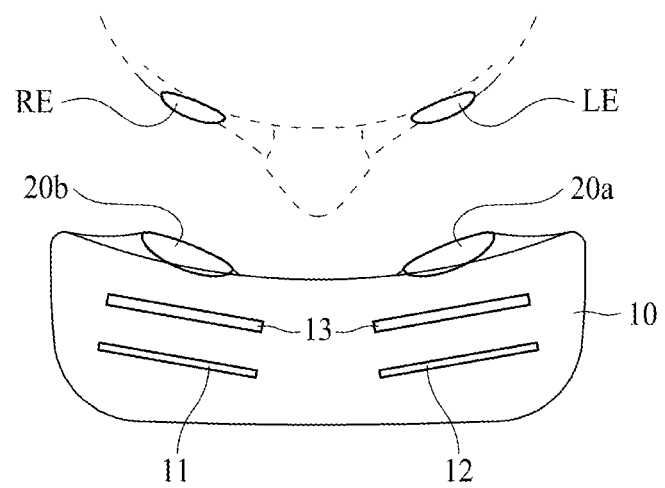
Figure 11C:
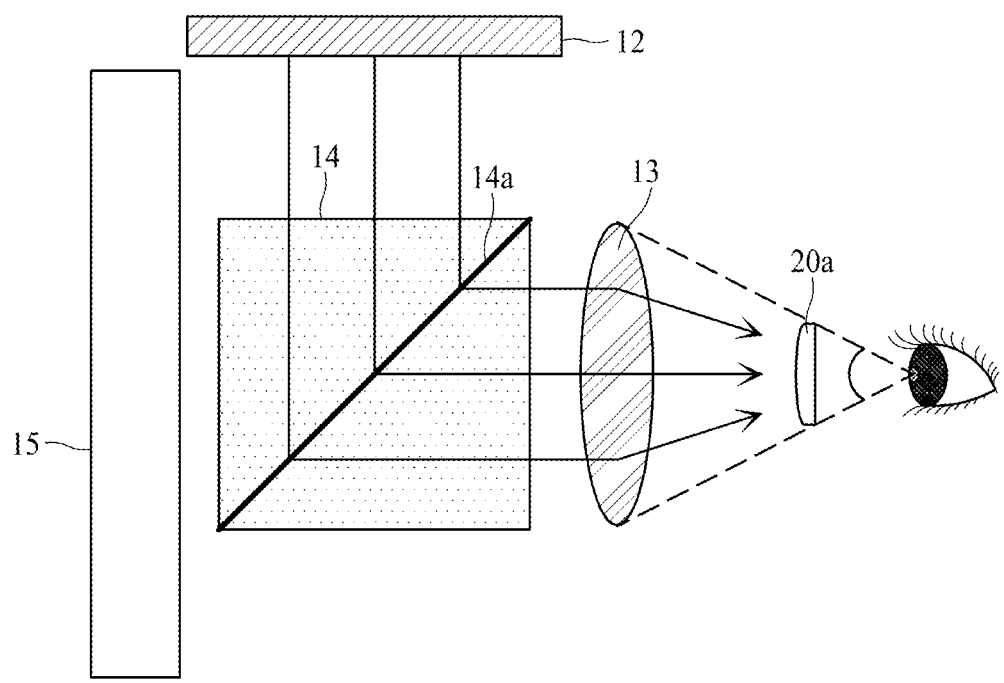

FIGS. 11A to 11C relate to an electroluminescent display apparatus according to another aspect of the present disclosure and relate to a head-mounted display (HMD) apparatus. FIG. 11A is a schematic perspective view, FIG. 11B is a schematic plan view of a virtual reality (VR) structure, and FIG. 11C is a schematic cross-sectional view of an augmented reality (AR) structure.

As seen in FIG. 11A, the HMD apparatus according to the present disclosure may include an accommodating case 10 and a head-mounted band 30.

The accommodating case 10 may accommodate elements such as a display apparatus, a lens array, and an eyepiece lens.

The head-mounted band 30 may be fixed to the accommodating case 10. The head-mounted band 30 is illustrated as being provided to surround an upper surface of both side surfaces of a user, but is not limited thereto. The head-mounted band 30 may fix the HMD apparatus to a head of a user and may be replaced by a glasses frame type structure or a helmet type structure.

As seen in FIG. 11B, an HMD apparatus having the VR structure according to the present disclosure may include a left-eye display apparatus 12, a right-eye display apparatus 11, a lens array 13, a left-eye eyepiece lens 20a, and a right-eye eyepiece lens 20b.

The left-eye display apparatus 12, the right-eye display apparatus 11, the lens array 13, the left-eye eyepiece lens 20a, and the right-eye eyepiece lens 20b may be accommodated into the accommodating case 10.

The left-eye display apparatus 12 and the right-eye display apparatus 11 may display the same image, and in this case, a user may watch a two-dimensional (2D) image. Alternatively, the left-eye display apparatus 12 may display a left-eye image, and the right-eye display apparatus 11 may display a right-eye image. Each of the left-eye display apparatus 12 and the right-eye display apparatus 11 may be configured as the electroluminescent display apparatus of each of FIGS. 1 to 10C. In this case, in FIGS. 1 to 10C, a surface (for example, an encapsulation layer 800) displaying an image may face the lens array 13.

The lens array 13 may be spaced apart from each of the left-eye eyepiece lens 20a and the left-eye display apparatus 12 and may be provided between the left-eye eyepiece lens 20a and the left-eye display apparatus 12. That is, the lens array 13 may be disposed in front of the left-eye eyepiece lens 20a and behind the left-eye display apparatus 12. Also, the lens array 13 may be spaced apart from each of the right-eye eyepiece lens 20b and the right-eye display apparatus 11 and may be provided between the right-eye eyepiece lens 20b and the right-eye display apparatus 11. That is, the lens array 13 may be disposed in front of the right-eye eyepiece lens 20b and behind the right-eye display apparatus 11.

The lens array 13 may be a micro-lens array. The lens array 13 may be replaced by a pin hole array. By using the lens array 13, an image displayed by the left-eye display apparatus 12 or the right-eye display apparatus 11 may be zoomed in by a certain magnification, and thus, a zoomed-in image may be seen by a user.

A left eye LE of a user may be located at the left-eye eyepiece lens 20a, and a right eye RE of the user may be located at the right-eye eyepiece lens 20b.

As seen in FIG. 11C, an HMD apparatus having the AR structure according to the present disclosure may include a left-eye display apparatus 12, a lens array 13, a left-eye eyepiece lens 20a, a transmissive reflection part 14, and a transmissive window 15. In FIG. 11C, for convenience, only left-eye elements are illustrated, and right-eye elements may be the same as the left-eye elements.

The left-eye display apparatus 12, the lens array 13, the left-eye eyepiece lens 20a, the transmissive reflection part 14, and the transmissive window 15 may be accommodated into the accommodating case 10.

The left-eye display apparatus 12 may be disposed in one side (for example, an upper side) of the transmissive reflection part 14 without covering the transmissive window 15. Therefore, the left-eye display apparatus 12 may provide an image to the transmissive reflection part 14 without covering an external background seen through the transmissive window 15.

The left-eye display apparatus 12 may be configured as the electroluminescent display apparatus of each of FIGS. 1 to 10C. In this case, in FIGS. 1 to 10C, a surface (for example, an encapsulation layer 800) displaying an image may face the lens array 13.

The lens array 13 may be provided between the left-eye eyepiece lens 20a and the transmissive reflection part 14.

The left eye of the user may be located at the left-eye eyepiece lens 20a.

The transmissive reflection part 14 may be disposed between the lens array 13 and the transmissive window 15. The transmissive reflection part 14 may include a reflection surface 14A which transmits a portion of light and reflects the other portion of the light. The reflection surface 14A may be provided so that an image displayed by the left-eye display apparatus 12 travels to the lens array 13. Accordingly, the user may see, through the transmissive window 15, all of the external background and the image displayed by the left-eye display apparatus 12. That is, the user may see one image which includes a real background and a virtual image, and thus, AR may be implemented.

The transmissive window 15 may be disposed in front of the transmissive reflection part 14.

According to the aspects of the present disclosure, a plurality of light emitting layers emitting different lights may be respectively patterned in subpixels by using a shield layer and a photoresist layer, and thus, the light emitting layers may be precisely patterned in the subpixels which are densely arranged.

Particularly, according to the aspects of the present disclosure, a protection layer may be provided on a first electrode and a bank, and the light emitting layers may be patterned on the protection layer, thereby protecting the first electrode and the bank in a process of removing the shield layer and the photoresist layer through a liftoff process and a process of additionally removing a remaining shield layer through an ashing process.

The above-described feature, structure, and effect of the present disclosure are included in at least one aspect of the present disclosure, but are not limited to only one aspect. Furthermore, the feature, structure, and effect described in at least one aspect of the present disclosure may be implemented through combination or modification of other aspects by those skilled in the art. Therefore, content associated with the combination and modification should be construed as being within the scope of the present disclosure.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:

1. An electroluminescent display apparatus comprising:
a first pixel including a first subpixel emitting light of a first color, a second subpixel emitting light of a second color, and a third subpixel emitting light of a third color, the first pixel being provided in a substrate;
a second pixel including a first subpixel emitting light of the first color, a second subpixel emitting light of the second color, and a third subpixel emitting light of the third color, the second pixel being provided in the substrate;
a first electrode in each of the first subpixel, the second subpixel, and the third subpixel in each of the first pixel and the second pixel;

a protection layer on the first electrode in each of the first subpixel, the second subpixel, and the third subpixel in each of the first pixel and the second pixel;

a light emitting layer on the protection layer; and a second electrode on the light emitting layer, wherein the protection layer comprises a first portion overlapping the first subpixel in each of the first pixel and the second pixel, a second portion overlapping the second subpixel in each of the first pixel and the second pixel, a third portion overlapping the third subpixel in each of the first pixel and the second pixel, a fourth portion overlapping a boundary between any two of the first subpixel, the second subpixel, and the third subpixel in each of the first pixel and the second pixel, and a fifth portion overlapping a boundary between the first pixel and the second pixel; and wherein a thickness of the first portion is thicker than a thickness of the second portion, a thickness of the second portion is thicker than a thickness of the third portion, and a thickness of the third portion is thicker than a thickness of the fourth portion.

2. The electroluminescent display apparatus of claim 1, wherein a thickness of the fifth portion is the same as a thickness of the fourth portion.

3. The electroluminescent display apparatus of claim 1, wherein a thickness of the fifth portion is thicker than a thickness of the fourth portion.

4. The electroluminescent display apparatus of claim 3, wherein a thickness of the fifth portion overlapping a boundary region between the first subpixel of the first pixel and the first subpixel of the second pixel is the same as a thickness of the first portion.

5. The electroluminescent display apparatus of claim 3, wherein a thickness of the fifth portion overlapping a boundary region between the second subpixel of the first pixel and the second subpixel of the second pixel is the same as a thickness of the second portion, and a thickness of the fifth portion overlapping a boundary region between the third subpixel of the first pixel and the third subpixel of the second pixel is the same as a thickness of the third portion.

6. The electroluminescent display apparatus of claim 1, wherein the light emitting layer comprises a lower layer and an upper layer provided on the lower layer, the lower layer includes a plurality of lower layers that are respectively patterned in the first subpixel, the second subpixel, and the third subpixel in each of the first pixel and the second pixel, and are spaced apart from one another, the upper layer is provided in a region of the first subpixel, a region of the second subpixel, a region of the third subpixel, and in a boundary region between any two of the first subpixel, the second subpixel, and the third subpixel in each of the first pixel and the second pixel.

7. The electroluminescent display apparatus of claim 6, wherein the lower layer provided in the first subpixel in each of the first pixel and the second pixel has a same pattern as the first portion of the protection layer, the lower layer provided in the second subpixel in each of the first pixel and the second pixel is provided to have a same pattern as a pattern of the second portion of the protection layer, and the lower layer provided in the third subpixel has a same pattern as the third portion of the protection layer.

8. The electroluminescent display apparatus of claim 7, wherein the lower layer provided in the first subpixel in each of the first pixel and the second pixel comprises a plurality of organic layers including a red light emitting layer, the lower layer provided in the second subpixel in each of the first pixel and the second pixel comprises a plurality of organic layers including a green light emitting layer, and the lower layer provided in the third subpixel comprises a plurality of organic layers including a blue light emitting layer.

9. The electroluminescent display apparatus of claim 1, wherein the light emitting layer includes a plurality of light emitting layers that are respectively patterned in the first subpixel, the second subpixel, and the third subpixel in each of the first pixel and the second pixel and are spaced apart from one another.

10. The electroluminescent display apparatus of claim 9, wherein the light emitting layer provided in the first subpixel in each of the first pixel and the second pixel has a same pattern as the first portion of the protection layer, the light emitting layer provided in the second subpixel in each of the first pixel and the second pixel has a same pattern as the second portion of the protection layer, and the light emitting layer provided in the third subpixel has a same pattern as the third portion of the protection layer.

11. The electroluminescent display apparatus of claim 1, further comprising a bank disposed between two adjacent subpixels among the first subpixel, the second subpixel and the third subpixel in each of the first pixel and the second pixel and covering a respective edge of the first electrode of each of the first, second, and third subpixels in each of the first pixel and the second pixel.

12. The electroluminescent display apparatus of claim 11, wherein the first portion extends to an upper surface of the first electrode of the first subpixel in each of the first pixel and the second pixel and a portion of an upper surface of the bank along a side surface of the bank adjacent to the first subpixel in each of the first pixel and the second pixel, the second portion extends to an upper surface of the first electrode of the second subpixel in each of the first pixel and the second pixel and a portion of an upper surface of the bank along a side surface of the bank adjacent to the second subpixel in each of the first pixel and the second pixel, the third portion extends to an upper surface of the first electrode of the third subpixel in each of the first pixel and the second pixel and a portion of an upper surface of the bank along a side surface of the bank adjacent to the third subpixel in each of the first pixel and the second pixel, and the fourth portion is provided on an upper surface of the bank between the first subpixel in each of the first pixel and the second pixel and the second subpixel in each of the first pixel and the second pixel and an upper surface of the bank between the second subpixel in each of the first pixel and the second pixel and the third subpixel in each of the first pixel and the second pixel.

13. The electroluminescent display apparatus of claim 12, wherein the fourth portion is connected to the first portion and the second portion between the first portion and the second portion and is connected to the second portion and the third portion between the second portion and the third portion.

14. The electroluminescent display apparatus of claim 1, wherein the protection layer has a thickness of 0.3 μm or less.

15. The electroluminescent display apparatus of claim 1, further comprising a lens array spaced apart from the substrate and an accommodating case accommodating the substrate and the lens array.

* * * * *